(12) United States Patent
Lin et al.

(10) Patent No.: US 12,142,565 B2
(45) Date of Patent: Nov. 12, 2024

(54) DIFFERENT VIA CONFIGURATIONS FOR DIFFERENT VIA INTERFACE REQUIREMENTS

(71) Applicant: Taiwan Semiconductor Manufacturing Co., Ltd., Hsin-Chu (TW)

(72) Inventors: Shih-Che Lin, Hsinchu (TW); Po-Yu Huang, Hsinchu (TW); Chao-Hsun Wang, Hsin-chu (TW); Kuo-Yi Chao, Hsinchu (TW); Mei-Yun Wang, Hsin-Chu (TW); Feng-Yu Chang, Kaohsiung (TW); Rueijer Lin, Hsinchu (TW); Wei-Jung Lin, Hsinchu (TW); Chen-Yuan Kao, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 282 days.

(21) Appl. No.: 17/874,804

(22) Filed: Jul. 27, 2022

(65) Prior Publication Data

US 2022/0359399 A1   Nov. 10, 2022

Related U.S. Application Data

(62) Division of application No. 16/984,884, filed on Aug. 4, 2020, now Pat. No. 11,532,561.

(Continued)

(51) Int. Cl.
*H01L 23/535* (2006.01)
*H01L 21/285* (2006.01)
(Continued)

(52) U.S. Cl.
CPC ...... *H01L 23/535* (2013.01); *H01L 21/28518* (2013.01); *H01L 21/31116* (2013.01);
(Continued)

(58) Field of Classification Search
CPC . H01L 23/535; H01L 23/481; H01L 23/5283; H01L 23/485; H01L 21/28518;
(Continued)

(56) References Cited

U.S. PATENT DOCUMENTS

| 10,083,863 | B1 | 9/2018 | Hsieh et al. |
| 2002/0056879 | A1* | 5/2002 | Wieczorek ........ H01L 21/76816 257/368 |
| 2012/0043592 | A1 | 2/2012 | Zhao et al. |

FOREIGN PATENT DOCUMENTS

| KR | 20150143263 A | 12/2015 |
| KR | 20180060943 A | 6/2018 |

(Continued)

*Primary Examiner* — Shahed Ahmed
*Assistant Examiner* — Vicki B. Booker
(74) *Attorney, Agent, or Firm* — HAYNES AND BOONE, LLP

(57) ABSTRACT

Vias, along with methods for fabricating vias, are disclosed that exhibit reduced capacitance and resistance. An exemplary interconnect structure includes a first source/drain contact and a second source/drain contact disposed in a dielectric layer. The first source/drain contact physically contacts a first source/drain feature and the second source/drain contact physically contacts a second source/drain feature. A first via having a first via layer configuration, a second via having a second via layer configuration, and a third via having a third via layer configuration are disposed in the dielectric layer. The first via and the second via extend into and physically contact the first source/drain contact and the second source/drain contact, respectively. A first thickness of the first via and a second thickness of the second via are the same. The third via physically contacts a gate (Continued)

structure, which is disposed between the first source/drain contact and the second source/drain contact.

20 Claims, 24 Drawing Sheets

Related U.S. Application Data

(60) Provisional application No. 62/907,823, filed on Sep. 30, 2019.

(51) Int. Cl.
*H01L 21/311* (2006.01)
*H01L 21/3213* (2006.01)
*H01L 21/768* (2006.01)
*H01L 23/48* (2006.01)
*H01L 29/45* (2006.01)

(52) U.S. Cl.
CPC .. *H01L 21/32134* (2013.01); *H01L 21/76805* (2013.01); *H01L 21/7684* (2013.01); *H01L 21/76843* (2013.01); *H01L 21/76895* (2013.01); *H01L 23/481* (2013.01); *H01L 29/45* (2013.01)

(58) Field of Classification Search
CPC ......... H01L 21/31116; H01L 21/32134; H01L 21/76805; H01L 21/7684; H01L 21/76843; H01L 21/76895; H01L 21/76847; H01L 21/76856; H01L 21/76879; H01L 29/45; H01L 29/41766
See application file for complete search history.

(56) References Cited

FOREIGN PATENT DOCUMENTS

| | | |
|---|---|---|
| KR | 20180117018 A | 10/2018 |
| KR | 20180131346 A | 12/2018 |
| KR | 20190064375 A | 6/2019 |

\* cited by examiner

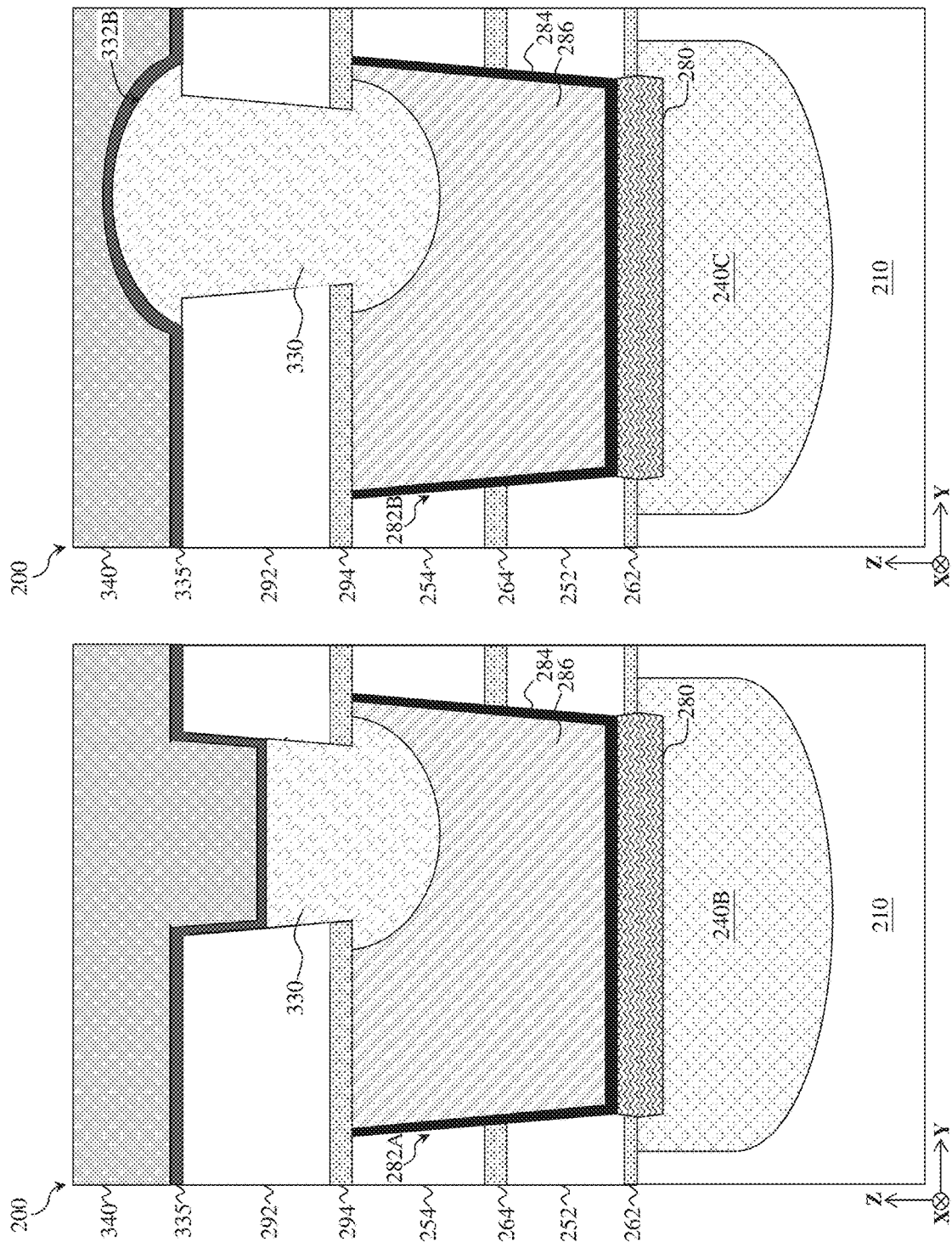

DIFFERENT VIA CONFIGURATIONS FOR DIFFERENT VIA INTERFACE REQUIREMENTS

This is a divisional application of U.S. patent application Ser. No. 16/984,884, filed Aug. 4, 2020, which is a non-provisional application of and claims benefit of U.S. Provisional Patent Application Ser. No. 62/907,823, filed Sep. 30, 2019, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay. A need thus exists for improvements in interconnects of ICs and/or methods of fabricating the interconnects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-6, FIGS. 7A-11A, FIGS. 7B-11B, FIGS. 7C-11C, and FIGS. 12-16 are fragmentary diagrammatic views of an integrated circuit device, in portion or entirety, at various stages of fabricating a multilayer interconnect structure, such as the method for fabricating the multilayer interconnect structure of the integrated circuit device of FIG. 1A and FIG. 1B, according to some embodiments of the present disclosure.

DETAILED DESCRIPTION

Figure 1A:
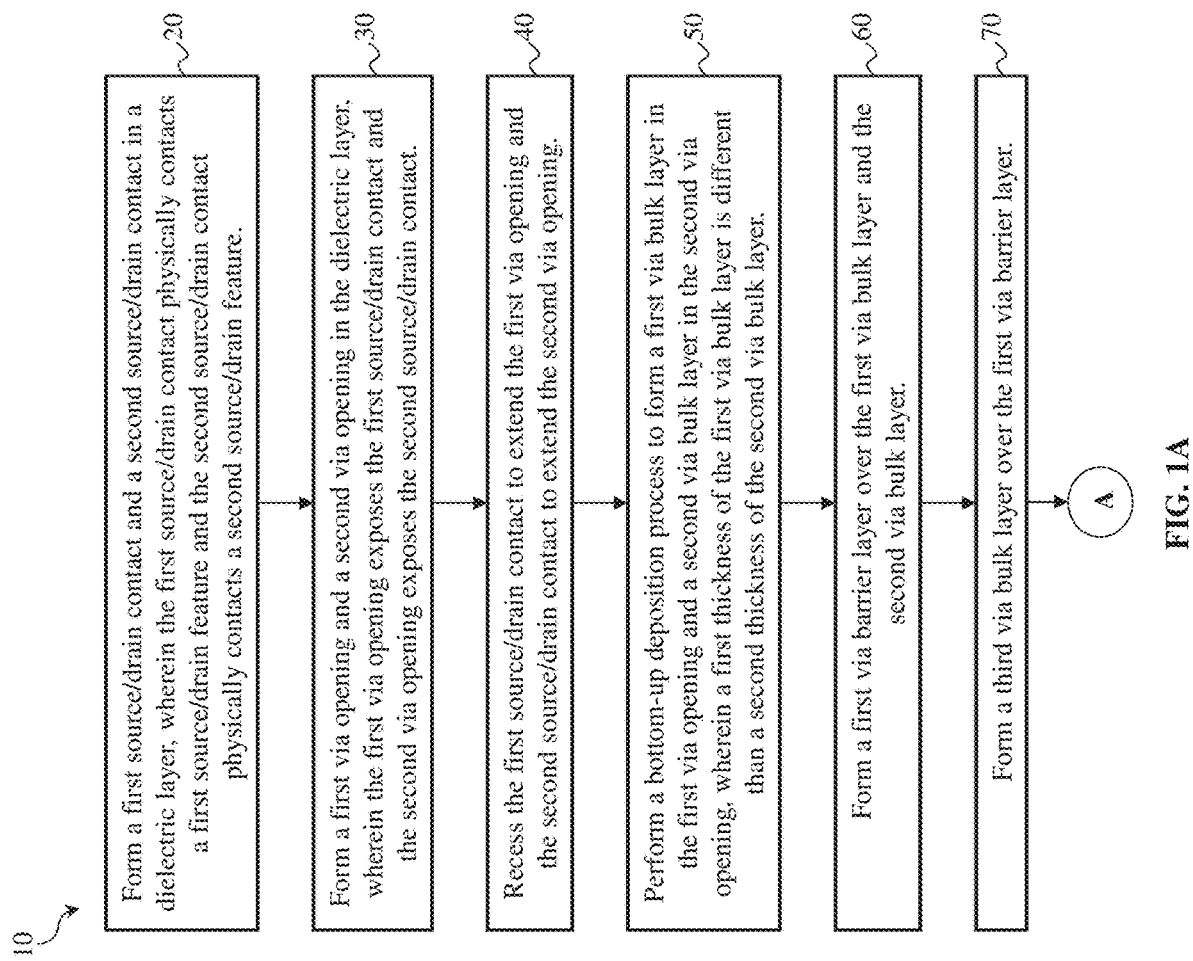
FIG. 1A and FIG. 1B are a flow chart of a method for fabricating a portion of a multilayer interconnect structure according to various aspects of the present disclosure.

The present disclosure relates generally to integrated circuit devices, and more particularly, to multilayer interconnect structures for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As IC technologies expand into sub-20 nm technology nodes, shrinking critical dimensions at device layers of ICs (e.g., gate lengths, gate pitches, fin pitches, etc.) have led to corresponding shrinking in critical dimensions of the interconnects (e.g., dimensions of vias, dimensions of metal lines, via pitches, metal line pitches, etc.) that facilitate operation of the device layers. This has presented unique challenges. For example, typically, vias to source/drain contacts (which are connected to source/drain features) and vias to gate structures have the same configuration and are fabricated using the same methods—filling a via opening in a dielectric layer with a metal fill layer disposed over a metal glue/barrier layer, where the metal glue/barrier layer is configured to enhance adhesion between the vias and the dielectric layer (for example, the metal glue/barrier layer lines sidewalls of the via opening defined by the dielectric layer), reduce contact resistance, and/or prevent diffusion of via constituents into the surrounding environment. As via CDs shrink, the metal glue/barrier layer consumes more space in the via opening, thereby reducing a remainder of the via opening for the metal fill layer. This has led to poor metal gap filling, where the metal fill layer is unable to fill the remainder of the via opening without forming gaps (or voids), which significantly increases contact resistance. One solution is to eliminate the metal glue/barrier layer and fabricate barrier-free vias. However, it has been observed that some vias, such as vias to gate structures, need the metal glue/barrier layer to optimize contact resistance reduction, while other vias, such as vias to source/drain contacts, need to eliminate the metal glue/barrier layer to optimize contact resistance reduction.

The present disclosure thus proposes mixing via configurations to accommodate different via interface requirements. For example, the present disclosure proposes fabricating vias at a same level of a multi-level interconnect (MLI) structure (for example, vias at a via-zero (M0), bottommost via layer) with different configurations/structures to optimize contact resistance reduction. In some embodiments, vias to gate structures include a metal glue/barrier layer, while vias to source/drain contacts do not include a metal glue/barrier layer. For the vias to the source/drain contacts, the proposed via fabrication methods include forming via openings in a dielectric layer that expose the source/drain contacts, recessing the source/drain contacts to extend the via openings, filling the extended via openings with a first metal fill material using a bottom-up deposition process, forming a metal glue/barrier layer over the first metal fill material (for example, by a conformal deposition process), forming a second metal fill material over the metal glue/barrier layer (for example, by a blanket deposition process), and performing a planarization process that removes any second metal fill material, metal glue/barrier layer, and/or first metal fill material disposed over a top surface of the dielectric layer. For the vias to the gate structures, the proposed via fabrication methods include forming via openings in a dielectric layer that expose the gate structures, forming a second metal glue/barrier layer along sidewalls of the via openings defined by the dielectric layer and a bottom of the via openings defined by the gate structure (for example, by a conformal deposition process), forming a third metal fill material over the second metal glue/barrier layer and filling a remainder of the via openings (for example, by a blanket deposition process), and performing a planarization process that removes any second metal glue/barrier layer and/or third metal fill material disposed over the top surface of the dielectric layer. In some embodiments, the vias to the gate structures are formed before forming the vias to the source/drain contacts. In some embodiments, the vias to the gate structures are formed after forming the vias to the source/drain contacts.

Recessing the source/drain contacts increases a contact area between the vias and the source/drain contacts. Process variations of the bottom-up deposition process result in different heights of the first metal fill material. For example, the first metal fill material may completely fill a first via opening to a first source/drain contact, while the first metal fill material may partially fill a second via opening to a second source/drain contact. In some embodiments, the first metal fill material completely fills the first via opening and extends above the top surface of the dielectric layer to form a via rivet head. As a height of the via rivet head increases (defined between a topmost surface of the via rivet head and the top surface of the dielectric layer), internal stress increases within the first metal fill material, which can lead to cracks during continual growth of the first metal fill material and/or during subsequent processing. In some embodiments, the bottom-up deposition process is tuned to constrain the height of the via rivet head to a predefined height that can minimize internal stress of the first metal fill material. In some embodiments, the metal glue/barrier layer is formed over the first metal fill material before forming the second metal fill material (which is needed to fill a remainder of via openings that are partially filled by the first metal fill material) to reduce internal stress in the first metal fill material and prevent cracking of metal fill layers of the vias. Such fabrication methods result in some vias to source/drain contacts having barrier-free interfaces and some vias to source/drain contacts having partial barrier interfaces. Details of the proposed methods for fabricating vias and resulting via structures and/or configurations are described herein.

Figure 1B:
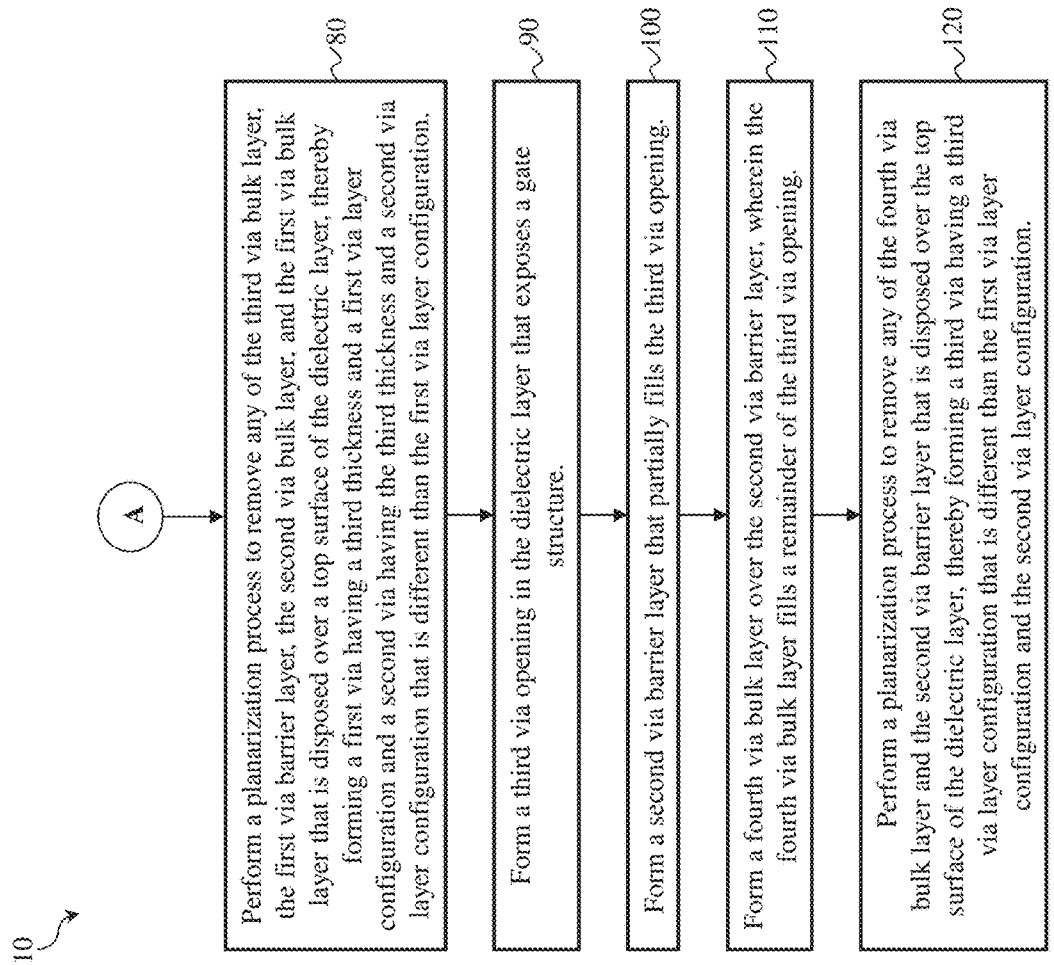

FIG. 1A and FIG. 1B are a flow chart of a method 10 for fabricating a portion of a multilayer interconnect structure of an integrated circuit device according to various aspects of the present disclosure. The portion of the multilayer interconnect structure fabricated by method 10 can reduce capacitance and/or resistance associated with the IC device, thereby reducing associated RC delay. At block 20, method 10 includes forming a first source/drain contact and a second source/drain contact in a dielectric layer. The first source/drain contact physically contacts a first source/drain feature. The second source/drain contact physically contacts a second source/drain feature. At block 30, method 10 includes forming a first via opening and a second via opening in the dielectric layer. The first via opening exposes the first source/drain contact and the second via opening exposes the second source/drain contact. At block 40, method 10 includes recessing the first source/drain contact to extend the first via opening and recessing the second source/drain contact to extend the second via opening. At block 50, a bottom-up deposition process is performed to form a first via bulk layer in the first via opening and a second via bulk layer in the second via opening. In some embodiments, a first thickness of the first via bulk layer is different (for example, greater or less) than a second thickness of the second via bulk layer. In some embodiments, a first thickness of the first via bulk layer is the same as a second thickness of the second via bulk layer. At block 60 and block 70, a first via barrier layer is formed over the first via bulk layer and the second via bulk layer and a third via bulk layer is formed over the first via barrier layer, respectively.

At block 80, method 10 includes performing a planarization process to remove any of the third via bulk layer, the first via barrier layer, the second via bulk layer, and the first via bulk layer that is disposed over a top surface of the dielectric layer, thereby forming a first via having a third thickness and a first via layer configuration and a second via having the third thickness and a second via layer configuration that is different than the first via layer configuration. At block 90, block 100, and block 110, a third via opening is formed in the dielectric layer that exposes a gate structure, a second via barrier layer is formed that partially fills the third via opening, and a fourth via bulk layer is formed over the second via barrier layer, respectively. The fourth via bulk layer fills a remainder of the third via opening. At block 120, method 10 includes performing a planarization process to remove any of the fourth via bulk layer and the second via barrier layer that is disposed over the top surface of the dielectric layer, thereby forming a third via having a third via layer configuration that is different than the first via layer configuration and the second via layer configuration. In some embodiments, the first via, the second via, and the third via are a portion of a bottommost via layer of the multilayer interconnect structure. In some embodiments, fabrication can proceed with forming additional layers of the multilayer interconnect structure, such as respective conductive lines over and physically contacting the first via, the second via, and the third via. Additional processing is contemplated by the present disclosure. Additional steps can be provided before, during, and after method 10, and some of the steps described can be moved, replaced, or eliminated for additional embodiments of method 10. The following discussion provides interconnects that can be fabricated according to method 10.

FIGS. 2-6, FIGS. 7A-11A, FIGS. 7B-11B, FIGS. 7C-11C, and FIGS. 12-16 are fragmentary diagrammatic views of an integrated circuit (IC) device 200, in portion or entirety, at various stages of fabricating a multilayer interconnect structure of IC device 200 (such as those associated with method 10 in FIG. 1), according to various aspects of the present disclosure. FIGS. 2-6, FIGS. 7A-11A, and FIGS. 12-16 are fragmentary cross-sectional views of IC device 200 in an X-Z plane at various fabrication stages according to various aspects of the present disclosure. FIGS. 7B-11B and FIGS. 7C-11C are fragmentary cross-sectional views of portions of IC device 200 in FIGS. 7A-11A in a Y-Z plane along lines at various fabrication stages according to various aspects of the present disclosure. IC device 200 may be included in a microprocessor, a memory, and/or other IC device. In some embodiments, IC device 200 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of IC device 200. FIGS. 2-6, FIGS. 7A-11A, FIGS. 7B-11B, FIGS. 7C-11C, and FIGS. 12-16 have been simplified for the sake of clarity to better understand the inventive concepts of the present disclosure. Additional features can be added in IC device 200, and some of the features described below can be replaced, modified, or eliminated in other embodiments of IC device 200.

Figure 2:
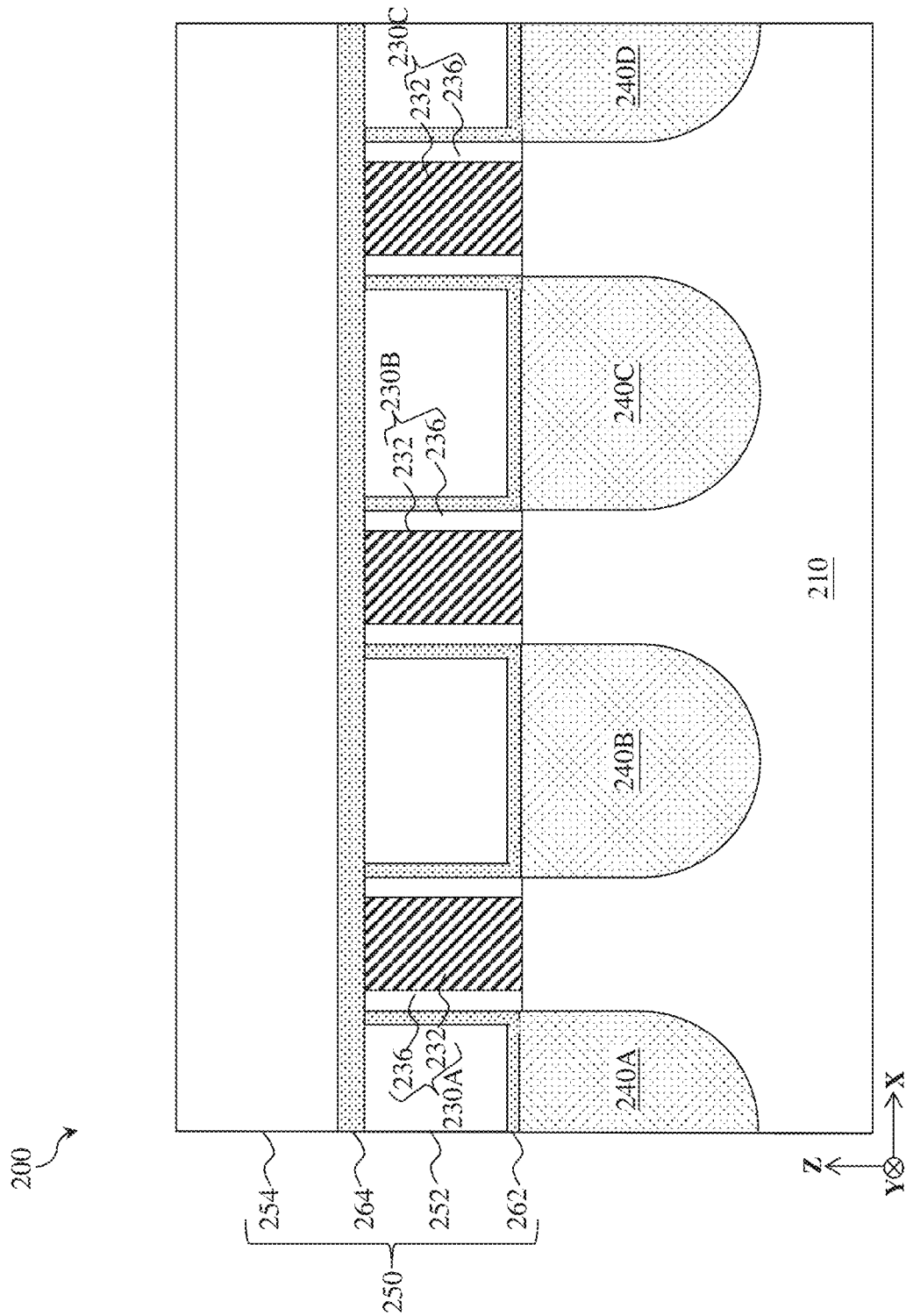

Turning to FIG. 2, IC device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 includes doped regions formed by an ion implantation process, a diffusion process, and/or other suitable doping process. In some embodiments, substrate 210 includes p-type doped regions (for example, p-type wells) doped with p-type dopants, such as boron, indium, other p-type dopant, or combinations thereof. In some embodiments, substrate 210 includes n-type doped regions (for example, n-type wells) doped with n-type dopants, such as phosphorus, arsenic, other n-type dopant, or combinations thereof. In some embodiments, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof.

Isolation features can be formed over and/or in substrate 210 to isolate various regions, such as device regions, of IC device 200. For example, isolation features define and electrically isolate active device regions and/or passive device regions from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. In some embodiments, isolation features are formed by etching a trench (or trenches) in substrate 210 and filling the trench with insulator material (for example, using a chemical vapor deposition (CVD) process or a spin-on glass process). A chemical mechanical polishing (CMP) process may be performed to remove excessive insulator material and/or planarize a top surface of isolation features. In some embodiments, isolation features can be formed by depositing an insulator material over substrate 210 after forming fin structures (in some embodiments, such that the insulator material fills gaps (trenches) between the fin structures) and etching back the insulator material. In some embodiments, isolation features include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some embodiments, isolation features include a dielectric layer disposed over a doped liner layer (including, for example, boron silicate glass (BSG) or phosphosilicate glass (PSG)).

Various gate structures are disposed over substrate 210, such as a gate structure 230A, a gate structure 230B, and a gate structure 230C. Each of gate structures 230A-230C engage a respective channel region defined between a respective source region and a respective drain region (referred to hereinafter as source/drain regions), such that current can flow between the respective source/drain regions during operation. In some embodiments, gate structures 230A-230C are formed over a fin structure, such that gate structure 230A-230C each wrap a portion of the fin structure and interpose respective source/drain regions of the fin structure. Gate structures 230A-230C each include a metal gate (MG) stack 232. MG stacks 232 are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plasma enhanced ALD (PEALD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. MG stacks 232 are fabricated according to a gate last process, a gate first process, or a hybrid gate last/gate first process. In gate last process embodiments, gate structures 230A-230C include dummy gate stacks that are subsequently, completely or partially, replaced with MG stacks 232. The dummy gate stacks include, for example, an interfacial layer (for example, a silicon oxide layer) and a dummy gate electrode layer (for example, a polysilicon layer) disposed over the interfacial layer. In such embodiments, the dummy gate electrode layer is removed, thereby forming openings that are filled with MG stacks 232. In some embodiments, the dummy gate stacks include a dummy gate dielectric layer disposed between the interfacial layer and the dummy gate electrode layer, which can be removed during the gate replacement process. In some embodiments, the dummy gate dielectric layer and/or the interfacial layer are not removed during the gate replacement process and form a portion of MG stacks 232.

MG stacks 232 are configured to achieve desired functionality according to design requirements of IC device 200, such that MG stacks 232 of gate structures 230A-230C may include the same or different layers and/or materials relative to one another. In some embodiments, MG stacks 232 include a gate dielectric (for example, a gate dielectric layer) and a gate electrode (for example, a work function layer and a bulk conductive layer). MG stacks 232 may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, the gate dielectric layer is a high-k dielectric layer. The gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a metal layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include poly silicon, Ti, Ta, metal alloys, other suitable materials, or combinations thereof.

Gate structures 230A-230C further include gate spacers 236, which are disposed adjacent to (for example, along sidewalls of) MG stacks 232. Gate spacers 236 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 210 and subsequently anisotropically etched to form gate spacers 236. In some embodiments, gate spacers 236 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to MG stacks 232. In such embodiments, the various sets of spacers can include materials having different etch rates. For example, a first dielectric layer including silicon and oxygen (for example, silicon oxide) can be deposited over substrate 210 and etched to form a first spacer set adjacent to MG stacks 232, and a second dielectric layer including silicon and nitrogen (for example, silicon nitride) can be deposited over substrate 210 and etched to form a second spacer set adjacent to the first spacer set. Implantation, diffusion, and/or annealing processes may be performed to form lightly doped source and drain (LDD) features and/or heavily doped source and drain (HDD) features in substrate 210 before and/or after forming gate spacers 236.

Epitaxial source features and epitaxial drain features (referred to as epitaxial source/drain features), such as an epitaxial source/drain feature 240A, an epitaxial source/drain feature 240B, an epitaxial source/drain feature 240C, and an epitaxial source/drain feature 240D, are disposed in source/drain regions of substrate 210. Gate structure 230A interposes epitaxial source/drain feature 240A and epitaxial source/drain feature 240B, such that a channel region is defined between epitaxial source/drain feature 240A and epitaxial source/drain feature 240B. Gate structure 230B interposes epitaxial source/drain feature 240B and epitaxial source/drain feature 240C, such that a channel region is defined between epitaxial source/drain feature 240B and epitaxial source/drain feature 240C. Gate structure 230C interposes epitaxial source/drain feature 240C and epitaxial source/drain feature 240D, such that a channel region is defined between epitaxial source/drain feature 240C and epitaxial source/drain feature 240D. In some embodiments, gate structure 230A, epitaxial source/drain feature 240A, and epitaxial source/drain feature 240B form a portion of a first transistor; gate structure 230B, epitaxial source/drain feature 240B, and epitaxial source/drain feature 240C form a portion of a second transistor; and gate structure 230C, epitaxial source/drain feature 240C, and epitaxial source/drain feature 240D form a portion of a third transistor.

In some embodiments, a semiconductor material is epitaxially grown on and/or from substrate 210 to form epitaxial source/drain features 240A-240D over source/drain regions of substrate 210. In some embodiments, an etching process is performed on source/drain regions of substrate 210 to form source/drain recesses, where epitaxial source/drain features 240A-240D are grown to fill the source/drain recesses. In some embodiments, where substrate 210 represents a portion of a fin structure, epitaxial source/drain features 240A-240D wrap source/drain regions of the fin structure and/or are disposed in source/drain recesses of the fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 210. Epitaxial source/drain features 240A-240D are doped with n-type dopants and/or p-type dopants. In some embodiments, epitaxial source/drain features 240A-240D are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 240A-240D are epitaxial layers including silicon and germanium, where the silicon-and-germanium-comprising epitaxial layers are doped with boron, other p-type dopant, or combinations thereof. In some embodiments, epitaxial source/drain features 240A-240D include materials and/or dopants that achieve desired tensile stress and/or compressive stress in the channel regions. In some embodiments, epitaxial source/drain features 240A-240D are doped during deposition by adding impurities to a source material of the epitaxy process. In some embodiments, epitaxial source/drain features 240A-240D are doped by an ion implantation process subsequent to a deposition process. In some embodiments, annealing processes are performed to activate dopants in epitaxial source/drain features 240A-240D and/or other source/drain features (for example, HDD regions and/or LDD regions).

A multilayer interconnect (MLI) feature 250 is disposed over substrate 210. MLI feature 250 electrically couples various devices (for example, transistors, resistors, capacitors, and/or inductors) and/or components (for example, gate structures 230A-230C and/or source/drain features 240A-240D) of IC device 200, such that the various devices and/or components can operate as specified by design requirements of IC device 200. MLI feature 250 includes a combination of dielectric layers and conductive layers (for example, metal layers) configured to form various interconnects. The conductive layers are configured to form vertical interconnects, such as device-level contacts and/or vias, and/or horizontal interconnects, such as conductive lines. Vertical interconnects typically connect horizontal interconnects in different layers (or different planes) of MLI feature 250. During operation of IC device 200, the interconnects route signals between the devices and/or the components of IC device 200 and/or distribute signals (for example, clock signals, voltage signals, and/or ground signals) to the devices and/or the components of IC device 200, along with routing and distributing signals between the devices and/or components of IC device 200 with devices and/or components external to IC device 200. MLI feature 250 is depicted with a given number of dielectric layers and conductive layers. The present disclosure contemplates MLI feature 250 having more or less dielectric layers and/or conductive layers depending on design requirements.

MLI feature 250 includes one or more insulating layers disposed over substrate 210, such as an interlayer dielectric (ILD) layer 252 (ILD-0), an interlayer dielectric (ILD) layer 254 (ILD-1), a contact etch stop layer (CESL) 262, and a contact etch stop layer (CESL) 264. ILD layer 252 is disposed over substrate 210, and ILD layer 254 is disposed over ILD layer 252. CESL 262 is disposed between ILD layer 252 and substrate 210, epitaxial source/drain features 240A-240C, and/or gate structures 230A-230C (in particular, gate spacers 236). CESL 264 is disposed between ILD layer 252, ILD layer 254, and/or gate structures 230A-230C. In some embodiments, a thickness of ILD layer 252 is about 10 nm to about 25 nm, a thickness of ILD layer 254 is about 10 nm to about 25 nm, a thickness of CESL 262 is about 1 nm to about 10 nm, and a thickness of CESL 264 is about 1 nm to about 10 nm. ILD layers 252, 254 and/or CESLs 262, 264 are formed over substrate 210 by a deposition process, such as CVD, PVD, ALD, HDPCVD, MOCVD, RPCVD, PECVD, LPCVD, ALCVD, APCVD, PEALD, other suitable methods, or combinations thereof. In some embodiments, ILD layer 252 and/or ILD layer 254 is formed by a high aspect ratio process (HARP), such as HDPCVD, which generally refers to a deposition process having parameters configured to achieve adequate filling in high aspect ratio structures. In some embodiments, ILD layer 252 and/or ILD layer 254 is formed by a flowable CVD (FCVD) process that includes, for example, depositing a flowable material (such as a liquid compound) over substrate 210 and converting the flowable material to a solid material by a suitable technique, such as thermal annealing and/or treating the flowable material with ultraviolet radiation. Subsequent to the deposition of ILD layer 252, ILD layer 254, CESL 262, and/or CESL 264, a CMP process and/or other planarization process may be performed, such that ILD layers 252, 254 and/or CESLs 262, 264 have substantially planar surfaces.

ILD layers 252, 254 include a dielectric material including, for example, silicon oxide, carbon doped silicon oxide, silicon nitride, silicon oxynitride, tetraethyl orthosilicate (TEOS), PSG, BSG, boron-doped phosphosilicate glass (BPSG), fluorine-doped silicate glass (FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other suitable dielectric material, or combinations thereof. In some embodiments, ILD layers 252, 254 include a low-k dielectric material, which generally refers to a dielectric material having a low dielectric constant relative to the dielectric constant of silicon dioxide (k≈3.9). For example, low-k dielectric material has a dielectric constant less than about 3.9. In some embodiments, the low-k dielectric material has a dielectric constant less than about 2.5, which can be referred to as an extreme low-k (ELK) dielectric material. In the depicted embodiment, ILD layers 252, 254 include an ELK dielectric material (and thus can be referred to as an ELK dielectric layer), such as silicon dioxide ($SiO_2$) (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. CESLs 262, 264 include a material different than ILD layers 252, 254, such as a dielectric material that is different than the dielectric material of ILD layer 252, 254. For example, where ILD layers 252, 254 include silicon and oxygen (for example, SiCOH, $SiO_x$, or other silicon-and-oxygen comprising material having a dielectric constant less than about 2.5), CESLs 262, 264 can include silicon and nitrogen and/or carbon (for example, SiN, SiCN, SiCON, SiON, SiC, and/or SiCO) (and can thus be referred to as a silicon nitride layer). In some embodiments, CESLs 262, 264 include a metal oxide and/or a metal nitride layer. ILD layer 252, 254 and/or CESLs 262, 264 can include a multilayer structure having multiple dielectric materials.

Figure 3:
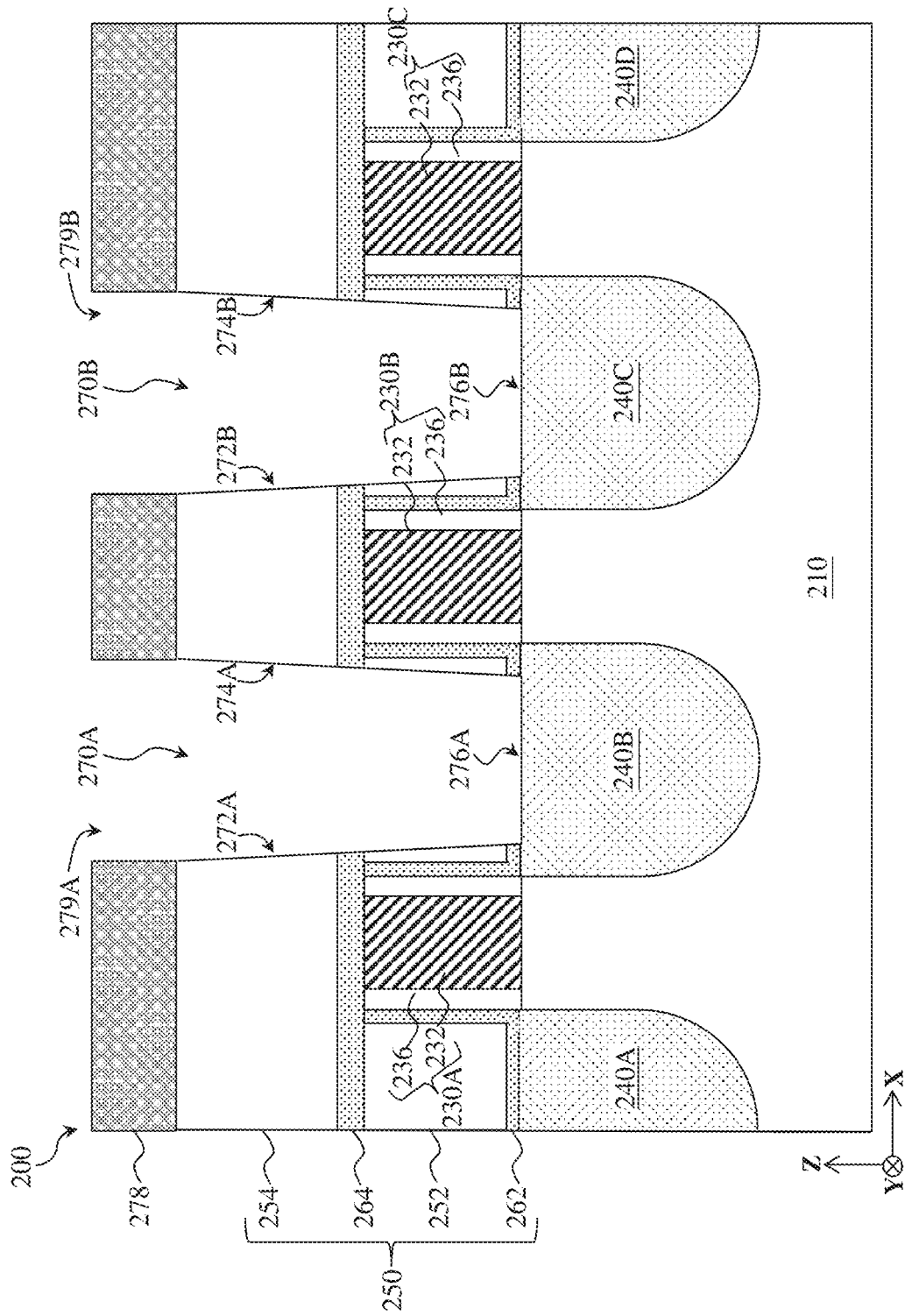

Turning to FIG. 3, one or more interconnect openings, such as an interconnect opening 270A and an interconnect opening 270B, are formed in a dielectric layer by a patterning process. Interconnect opening 270A and interconnect opening 270B extend vertically through ILD layer 254, CESL 264, ILD layer 252, and CESL 262 to expose epitaxial source/drain feature 240B and epitaxial source/drain feature 240C, respectively. Interconnect openings 270A, 270B may thus be referred to as source/drain contact (plug) openings. Interconnect opening 270A includes a sidewall 272A (defined by ILD layer 254, CESL 264, ILD layer 252, and CESL 262), a sidewall 274A (defined by ILD layer 254, CESL 264, ILD layer 252, and CESL 262), and a bottom 276A (defined by epitaxial source/drain feature 240B) that extends between sidewall 272A and sidewall 274A. Interconnect opening 270B includes a sidewall 272B (defined by ILD layer 254, CESL 264, ILD layer 252, and CESL 262), a sidewall 274B (defined by ILD layer 254, CESL 264, ILD layer 252, and CESL 262), and a bottom 276B (defined by epitaxial source/drain feature 240C) that extends between sidewall 272B and sidewall 274B. In FIG. 3, each of interconnect openings 270A, 270B has a trapezoidal shape, though the present disclosure contemplates interconnect openings 270A, 270B having other shapes, such as a rectangular shape. Sidewalls 272A, 274A are tapered, such that a bottom width of interconnect opening 270A exposing epitaxial source/drain feature 240B is less than a top width of interconnect opening 270A at a top surface of ILD layer 254. A width of interconnect opening 270A thus decreases along the z-direction from the top width of interconnect opening 270A to the bottom width of interconnect opening 270A. Sidewalls 272B, 274B are tapered, such that a bottom width of interconnect opening 270B exposing epitaxial source/drain feature 240C is less than a top width of interconnect opening 270B at a top surface of ILD layer 254. A width of interconnect opening 270B thus decreases along the z-direction from the top width of interconnect opening 270B to the bottom width of interconnect opening 270B.

In some embodiments, the patterning process includes performing a lithography process to form a patterned mask layer 278 having an opening 279A (substantially aligned with epitaxial source/drain feature 240B) and an opening 279B (substantially aligned with epitaxial source/drain feature 240C) therein over ILD layer 254 and performing an etching process to transfer a pattern defined in patterned mask layer 278 to an underlying dielectric layer (here, ILD layer 254, CESL 264, ILD layer 252, and CESL 262). The lithography process can include forming a resist layer on ILD layer 254 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, electron-beam writing, and/or ion-beam writing.

In some embodiments, the patterned resist layer is patterned mask layer 278. In such embodiments, the patterned resist layer is used as an etch mask to remove portions of the underlying dielectric layer (here, ILD layer 254, CESL 264, ILD layer 252, and/or CESL 262) exposed by openings 279A, 279B. In some embodiments, the patterned resist layer is formed over a mask layer formed over the underlying dielectric layer before forming the resist layer, and the patterned resist layer is used as an etch mask to remove portions of the mask layer formed over the underlying dielectric layer, thereby forming patterned mask layer 278. In such embodiments, the patterned mask layer is used as an etch mask to remove portions of ILD layer 254, CESL 264, ILD layer 252, and CESL 262 exposed by openings 279A, 279B. The etching process can include a dry etching process (for example, a reactive ion etching (RIE) process), a wet etching process, other suitable etching process, or combinations thereof. Various selective etching processes can be performed to form interconnect openings 270A, 270B. For example, the etching process can include a first etch that selectively etches ILD layer 254 relative to patterned mask layer 278 and CESL 264, such that the first etch stops upon reaching CESL 264; a second etch that selectively etches CESL 264 relative to ILD layers 254, 252, such that the second etch stops upon reaching ILD layer 252; a third etch that selectively etches ILD layer 252 relative to CESLs 262, 264, such that the third etch stops upon reaching CESL 262; and a fourth etch that selectively etches CESL 262 relative to ILD layers 252, 254 and epitaxial source/drain features 240B, 240C, such that the fourth etch stops upon reaching epitaxial source/drain features 240B, 240C. In some embodiments, the first etch, the second etch, the third etch, and the fourth etch may be configured to slightly over etch. For example, the first etch may partially etch CESL 264, the second etch may partially etch ILD layer 252, the third etch may partially etch CESL 262, and/or the fourth etch may partially etch epitaxial source/drain features 240B, 240C. In some embodiments, the first etch, the second etch, the third etch, and the fourth etch are similar to etch processes described herein for etching ILDs and CESLs. In some embodiments, the etching process may include multiple steps for etching CESLs 262, 264. In some embodiments, the etching process implements an etchant with low etch selectivity between ILD layers 254, 252 and CESLs 262, 264, such that interconnect openings 270A, 270B are formed by a single etch step based on, for example, time. In some embodiments, after the etching process, patterned mask layer 278 is removed from ILD layer 254 (in some embodiments, by a resist stripping process). In some embodiments, patterned mask layer 278 is removed during etching of ILD layer 254, CESL 264, ILD layer 252, and/or CESL 262.

Figure 4:
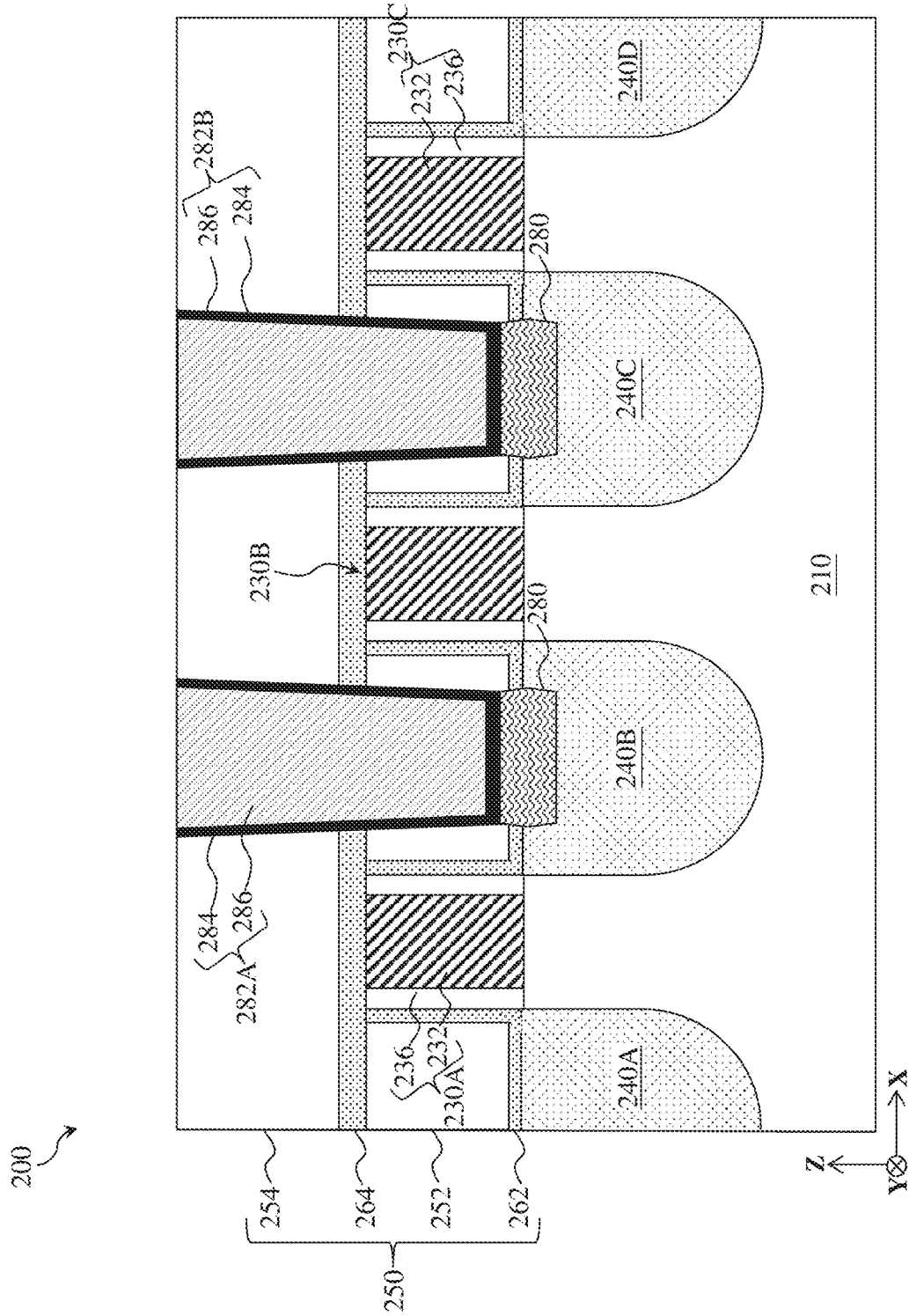

Turning to FIG. 4, silicide layers 280 are formed on epitaxial source/drain features 240B, 240C. Silicide layers 280 extend through CESL 262. In the depicted embodiment, top surfaces of silicide layers 280 are disposed higher than a top surface of CESL 262 relative to a top surface of substrate 210. In some embodiments, the top surfaces of silicide layers 280 are disposed lower and/or substantially planar with the top surface of CESL 262 relative to the top surface of substrate 210. In some embodiments, the top surfaces of silicide layers 280 are disposed lower than the top surface of substrate 210. Silicide layers 280 may be formed by depositing a metal layer over epitaxial source/drain features 240B, 240C and heating IC device 200 (for example, subjecting IC device 200 to an annealing process) to cause constituents of epitaxial source/drain features 240B, 240C (for example, silicon and/or germanium) to react with metal constituents of the metal layer. The metal layer includes any metal constituent suitable for promoting silicide formation, such as nickel, platinum, palladium, vanadium, titanium, cobalt, tantalum, ytterbium, zirconium, other suitable metal, or combinations thereof. Silicide layers 280 thus include a metal constituent and a constituent of epitaxial source/drain features 240B, 240C, such as silicon and/or germanium. In some embodiments, silicide layers 280 include nickel silicide, titanium silicide, or cobalt silicide. Any un-reacted metal, such as remaining portions of the metal layer, may be selectively removed relative to silicide layers 280 and/or a dielectric material, for example, by an etching process.

Then, a source/drain contact 282A and a source/drain contact 282B are respectively formed in interconnect opening 270A and interconnect opening 270B. Source/drain contacts 282A, 282B each extend through ILD layer 254, CESL 264, and ILD layer 252 to silicide layers 280, such that source/drain contacts 282A, 282B are disposed on silicide layers 280, respectively, on epitaxial source/drain features 240B, 240C. In some embodiments, depending on a configuration of silicide layers 280, source/drain contacts 282A, 282B can extend partially or entirely through CESL 262. Source/drain contacts 282A, 282B each include a contact barrier layer 284 and a contact bulk layer 286 disposed over contact barrier layer 284. Contact barrier layer 284 is disposed on sidewalls 272A, 272B, sidewalls 274A, 274B, and bottoms 276A, 276B respectively of interconnect openings 270A, 270B. For example, contact barrier layer 284 physically contacts sidewalls 272A, 272B, sidewalls 274A, 274B, and bottoms 276A, 276B respectively of interconnect openings 270A, 270B. In some embodiments, source/drain contacts 282A, 282B are formed by performing a first deposition process to form a contact barrier material over ILD layer 254 that partially fills interconnect openings 270A, 270B and performing a second deposition process to form a contact bulk material over the contact barrier material, where the contact bulk material fills a remainder of interconnect openings 270A, 270B. In such embodiments, contact barrier material and contact bulk material are disposed in interconnect openings 270A, 270B and over the top surface of ILD layer 254. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, contact barrier layer 284 has a substantially uniform thickness along sidewalls 272A, 272B, sidewalls 274A, 274B, and bottoms 276A, 276B respectively of interconnect openings 270A, 270B. Contact barrier layer 284 may thus be formed by a conformal deposition process. A CMP process and/or other planarization process is performed to remove excess contact bulk material and contact barrier material, for example, from over the top surface of ILD layer 254, resulting in source/drain contacts 282A, 282B (in other words, contact barrier layer 284 and contact bulk layer 286 filling interconnect openings 270A, 270B). The CMP process planarizes a top surface of source/drain contacts 282A, 282B, such that in some embodiments, the top surface of ILD layer 254 and top surfaces of source/drain contacts 282A, 282B form a substantially planar surface.

Contact barrier layer 284 includes a material that promotes adhesion between a surrounding dielectric material (here, ILD layer 254, CESL 264, and/or ILD layer 252) and contact bulk layer 286. The material of contact barrier layer 284 may further prevent diffusion of metal constituents (for example, metal atoms/ions) from source/drain contacts 282A, 282B into the surrounding dielectric material. In some embodiments, contact barrier layer 284 includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, contact barrier layer 284 includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, contact barrier layer 284 includes multiple layers. For example, contact barrier layer 284 may include a first sub-layer that includes titanium and a second sub-layer that includes titanium nitride. In another example, contact barrier layer 284 may include a first sub-layer that includes tantalum and a second sub-layer that includes tantalum nitride. Contact bulk layer 286 includes tungsten, ruthenium, cobalt, copper, aluminum, iridium, palladium, platinum, nickel, low resistivity metal constituent, alloys thereof, or combinations thereof. In the depicted embodiment, contact bulk layer 286 includes tungsten, ruthenium, and/or cobalt. In some embodiments, source/drain contacts 282A, 282B do not include contact barrier layer 284 (i.e., source/drain contacts 282A, 282B are barrier-free contacts), such that contact bulk layer 286 physically contacts ILD layer 254, CESL 264, ILD layer 252, silicide layer 280, and/or epitaxial source/drain features 240B, 240C. In some embodiments, source/drain contacts 282A, 282B are partially barrier-free, where contact barrier layer 284 is disposed between a dielectric layer of MLI feature 250 and a portion of contact bulk layer 286. In some embodiments, contact bulk layer 286 includes multiple layers.

Figure 5:
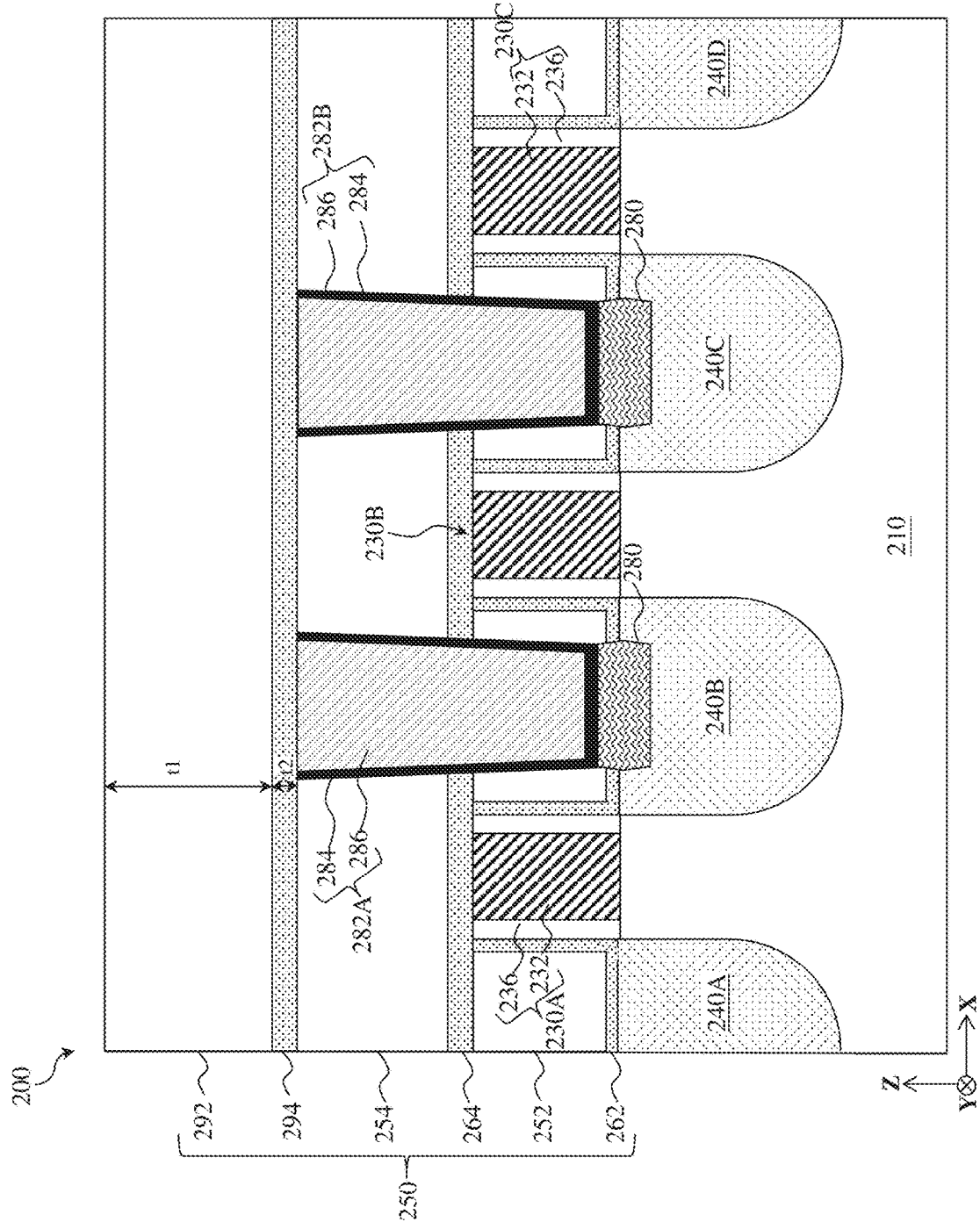

Turning to FIG. 5, processing proceeds with forming another dielectric layer of MLI feature 250. For example, an ILD layer 292 is formed over ILD layer 254 and source/drain contacts 282A, 282B. ILD layer 292 is similar to ILD layer 254. For example, ILD layer 292 is formed by a deposition process, such as CVD, PVD, ALD, HDPCVD, MOCVD, RPCVD, PECVD, LPCVD, ALCVD, APCVD, PEALD, FCVD, other suitable deposition methods, or combinations thereof. ILD layer 292 includes a dielectric material including, for example, silicon oxide, carbon doped silicon oxide, silicon nitride, silicon oxynitride, TEOS, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 292 includes a low-k dielectric material. For example, in the depicted embodiment, ILD layer 292 includes an ELK dielectric material, such as silicon dioxide ($SiO_2$) (for example, porous silicon dioxide), silicon carbide (SiC), and/or carbon-doped oxide (for example, SiCOH-based material (having, for example, Si—CH$_3$ bonds)), each of which is tuned/configured to exhibit a dielectric constant less than about 2.5. In some embodiments, ILD layer 292 may include a multilayer structure having multiple dielectric materials. In some embodiments, ILD layer 292 has a thickness t1 of about 10 nm to about 120 nm. Subsequent to the deposition of ILD layer 292, a CMP process and/or other planarization process may be performed, such that ILD layer 292 has a substantially planar surface.

In some embodiments, a CESL 294 is formed over ILD layer 254 and source/drain contacts 282A, 282B before forming ILD layer 292, such that CESL 294 is disposed between ILD layer 292 and ILD layer 254 and source/drain contacts 282A, 282B. CESL 294 is similar to CESL 264. For example, CESL 294 includes a material different than ILD layer 292, such as a dielectric material that is different than the dielectric material of ILD layer 292 to achieve etching selectivity during subsequent etching processes, such as those used to form interconnect openings that expose source/drain contacts 282A, 282B. In other words, CESL 294 and its surrounding layers will include materials having distinct etching sensitivities to a given etchant. For example, CESL 294 includes a material having an etch rate to an etchant that is less than an etch rate of a material of ILD layer 292 to the etchant so that the material of CESL 294 acts as an etch stop during etching of overlying ILD layer 292. The material of CESL 294 may also be configured to promote adhesion between CESL 294 and ILD layer 292. In some embodiments, CESL 294 includes silicon and nitrogen and/or carbon (for example, SiN, SiCN, SiCON, SiON, SiC, and/or SiCO). In some embodiments, CESL 294 includes a metal oxide layer and/or a metal nitride layer. The metal can include aluminum, hafnium, titanium, copper, manganese, vanadium, other suitable metal, or combinations thereof. In some embodiments, CESL 294 includes multiple layers. CESL 294 is formed by CVD, PVD, ALD, HDPCVD, MOCVD, RPCVD, PECVD, LPCVD, ALCVD, APCVD, PEALD, FCVD, other suitable deposition methods, or combinations thereof. In some embodiments, CESL 294 has a thickness t2 of about 1 nm to about 30 nm. Subsequent to the deposition of CESL 294, a CMP process and/or other planarization process may be performed, such that CESL 294 has a substantially planar surface.

Figure 6:
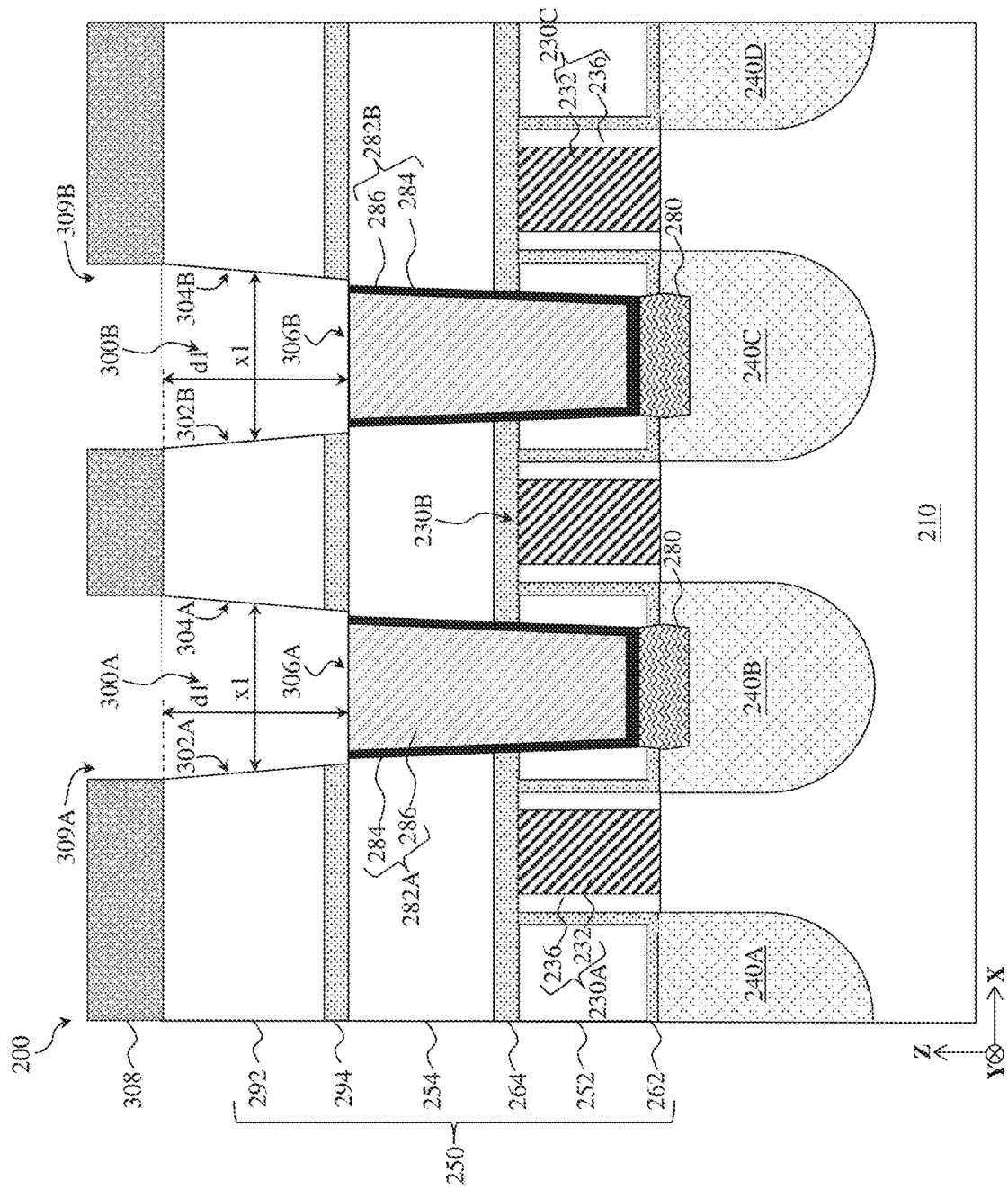

Turning to FIG. 6, one or more interconnect openings, such as an interconnect opening 300A and an interconnect opening 300B, are formed in a dielectric layer (for example, ILD layer 292 and CESL 294) by a patterning process. Interconnect opening 300A extends vertically through ILD layer 292 and CESL 294 to expose source/drain contact 282A. Interconnect opening 300B extends vertically through ILD layer 292 and CESL 294 to expose source/drain contact 282B. Interconnect openings 300A, 300B may thus be referred to as via openings. Interconnect opening 300A includes a sidewall 302A (defined by ILD layer 292 and CESL 294), a sidewall 304A (defined by ILD layer 292 and CESL 294), and a bottom 306A (defined by source/drain contact 282A) that extends between sidewall 302A and sidewall 304A. Interconnect opening 300B includes a sidewall 302B (defined by ILD layer 292 and CESL 294), a sidewall 304B (defined by ILD layer 292 and CESL 294), and a bottom 306B (defined by source/drain contact 282B) that extends between sidewall 302B and sidewall 304B. Interconnect openings 300A, 300B have a width x1 defined between sidewalls 302A, 302B and sidewalls 304A, 304B, respectively, and a depth d1 defined between a top surface of ILD layer 292 and source/drain contacts 282A, 282B, respectively. In some embodiments, width x1 is about 10 nm to about 30 nm, and depth d1 is about 10 nm to about 150 nm (for example, about 20 nm to about 80 nm). As CDs of interconnect openings 300A, 300B shrink for advanced IC technology nodes, any subsequently formed metal glue/barrier layer will consume more space in interconnect openings 300A, 300B, thereby reducing a remainder of interconnect openings 300A, 300B for a subsequently formed metal fill layer. This can lead to poor metal gap filling, where the metal fill layer is unable to fill a remainder of interconnect openings 300A, 300B without forming gaps (or voids), which significantly increases contact resistance. In some embodiments, an aspect ratio (e.g., d1/x1) of interconnect openings 300A, 300B is greater than or equal to about 3. In some embodiments, the aspect ratio is about 5 to about 15. Since aspect ratios greater than or equal to about 3 can introduce gap filling issues, as described further below, the present disclosure reduces the aspect ratio of interconnect openings 300A, 300B (for example, to aspect ratios less than about 3) before forming a metal glue/barrier layer, which can prevent or minimize formation of gaps within interconnects formed in interconnect openings 300A, 300B. In FIG. 6, each of interconnect openings 300A, 300B has a trapezoidal shape, though the present disclosure contemplates interconnect openings 300A, 300B having other shapes, such as a rectangular shape. Sidewalls 302A, 304A are tapered, such that a bottom width of interconnect opening 300A exposing source/drain contact 282A is less than a top width of interconnect opening 300A at a top surface of ILD layer 292. Width x1 of interconnect opening 300A thus decreases along the z-direction from the top width of interconnect opening 300A to the bottom width of interconnect opening 300A. Sidewalls 302B, 304B are tapered, such that a bottom width of interconnect opening 300B exposing source/drain contact 282B is less than a top width of interconnect opening 300B at a top surface of ILD layer 292. Width x1 of interconnect opening 300B thus decreases along the z-direction from the top width of interconnect opening 300B to the bottom width of interconnect opening 300B. In the depicted embodiment, interconnect openings 300A, 300B have bottom widths that are greater than widths of source/drain contacts 282A, 282B, such that interconnect openings 300A, 300B also expose portions of ILD layer 254. In some embodiments, bottom widths are smaller or substantially the same as the widths of source/drain contacts 282A, 282B.

In some embodiments, the patterning process includes performing a lithography process to form a patterned mask layer 308 having an opening 309A (substantially aligned with source/drain contacts 282A) and an opening 309B (substantially aligned with source/drain contacts 282B) therein over ILD layer 292 and performing an etching process to transfer a pattern defined in patterned mask layer 308 to ILD layer 292 and CESL 294. The lithography process can include forming a resist layer on ILD layer 292 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed)

portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, electron-beam writing, and/or ion-beam writing. In some embodiments, the patterned resist layer is patterned mask layer 308. In such embodiments, the patterned resist layer is used as an etch mask to remove portions of ILD layer 292 and CESL 294 exposed by openings 309A, 309B. In some embodiments, the patterned resist layer is formed over a mask layer formed over ILD layer 292 before forming the resist layer, and the patterned resist layer is used as an etch mask to remove portions of the mask layer formed over ILD layer 292, thereby forming patterned mask layer 308. In such embodiments, the patterned mask layer is used as an etch mask to remove portions of ILD layer 292 and CESL 294 exposed by openings 309A, 309B. In some embodiments, after the etching process, patterned mask layer 308 is removed from ILD layer 292 (in some embodiments, by a resist stripping process). In some embodiments, patterned mask layer 308 is removed during etching of ILD layer 292 and/or CESL 294.

The etching process can include a dry etching process, a wet etching process, other suitable etching process, or combinations thereof. For example, the etching process is a dry etch process, such as an RIE process, that uses a fluorine-containing etch gas to remove the material of ILD layer 292 (e.g., silicon-and-oxygen comprising material) and the material of CESL 294 (e.g., silicon-and-nitrogen comprising material) at a higher rate than the materials of patterned mask layer 308 and/or source/drain contacts 282A, 282B (e.g., metal-comprising material) (i.e., the etchant has a high etch selectivity with respect to ILD layer 292 and CESL 294). In some embodiments, the dry etch process is configured to generate a fluorine-containing plasma from the fluorine-containing etch gas, such that the dry etch process removes ILD layer 292 and CESL 294 using plasma-excited fluorine-containing species. The fluorine-containing etch gas includes fluorine ($F_2$), fluoromethane (e.g., $CH_3F$), difluoromethane (e.g., $CH_2F_2$), trifluoromethane (e.g., $CHF_3$), tetrafluoromethane (e.g., $CF_4$), hexafluoroethane (e.g., $C_2F_6$), sulfur hexafluoride (e.g., $SF_6$), nitrogen trifluoride (e.g., $NF_3$), other fluorine-containing etchant, or combinations thereof. The dry etch can, alternatively or additionally, use a hydrogen-containing etch gas (for example, $H_2$ and/or $CH_4$), a nitrogen-containing etch gas (for example, $N_2$ and/or $NH_3$), a chlorine-containing etch gas (for example, $Cl_2$, $CHCl_3$, $CCl_4$, and/or $BCl_3$), an oxygen-containing etch gas (for example, $O_2$), a bromine-containing etch gas (for example, HBr and/or $CHBr_3$), an iodine-containing etch gas, other suitable etch gas, or combinations thereof. The dry etch may be configured to generate a plasma from any of the etch gases disclosed herein, such that the dry etch uses plasma-excited species for removing ILD layer 292 and CESL 294. In some embodiments, a carrier gas is used to deliver the fluorine-containing etch gas and/or other etch gas. The carrier gas may be an inert gas, such as an argon-containing gas, a helium-containing gas, a xenon-containing gas, other suitable inert gas, or combinations thereof.

In some embodiments, the dry etch utilizes an etch gas that includes $CF_4$ to selectively etch ILD layer 292 and CESL 294. In some embodiments, the dry etch utilizes an etch gas that includes $CF_4$ combined with $O_2$, $N_2$, and/or $H_2$. A flow rate of $CF_4$, a flow rate of $O_2$, flow rate of $N_2$, a flow rate of $H_2$, a ratio of $CF_4$ to $O_2$, $N_2$, and/or $H_2$, an etch time, an etch temperature, an etch pressure, and/or an RF power may be tuned to achieve desired etch selectivity. In some embodiments, a flow rate of $CF_4$ is about 10 sccm to about 1,000 sccm. In some embodiments, a duration of the dry etch is about 5 seconds to about 50 seconds. In some embodiments, an RF power used for generating a fluorine-containing plasma is about 100 W to about 1,000 W. In some embodiments, a pressure maintained in a process chamber during the dry etch is about 10 mTorr to about 1,000 mTorr. In some embodiments, a temperature maintained in the process chamber during the dry etch is about 18° C. to about 100° C. In some embodiments, the etch process is a multi-step (stage) etch process that includes a first etch step that selectively etches ILD 292 and a second etch step that selectively etches CESL 294. For example, the first etch step is configured to remove ILD layer 292 but not remove or substantially remove CESL 294 so that the first etch stops upon reaching CESL 294, while the second etch step is configured to remove CESL 294 but not remove or substantially remove ILD 292 and source/drain contacts 282A, 282B so that the second etch stops upon reaching source/drain contacts 282A, 282B. Various etch parameters can be tuned to achieve selective etching of ILD layer 292 and CESL 294. For example, for the first etch step, an etchant is selected for the etching process that etches the material of ILD layer 292 at a higher rate than the material of CESL 294 (i.e., the etchant has a high etch selectivity with respect to the material of ILD layer 292). For the second etch step, an etchant is selected for the etching process that etches the material of CESL 294 at a higher rate than the material of ILD layer 292 (i.e., the etchant has a high etch selectivity with respect to the material of CESL 294). In some embodiments, the first etch step and the second etch step can use the same etchant but different flow rates and/or concentrations of constituents of the etchant. In some embodiments, the first etch step and/or the second etch step may be configured to slightly over etch. In such embodiments, the first etch step may partially etch CESL 294 and/or the second etch step may partially etch source/drain contacts 282A, 282B. In some embodiments, the second etch step may include multiple steps for selectively etching each layer of CESL 294, where each step is configured to selectively etch a respective one of the layers of CESL 294.

Figure 7A:
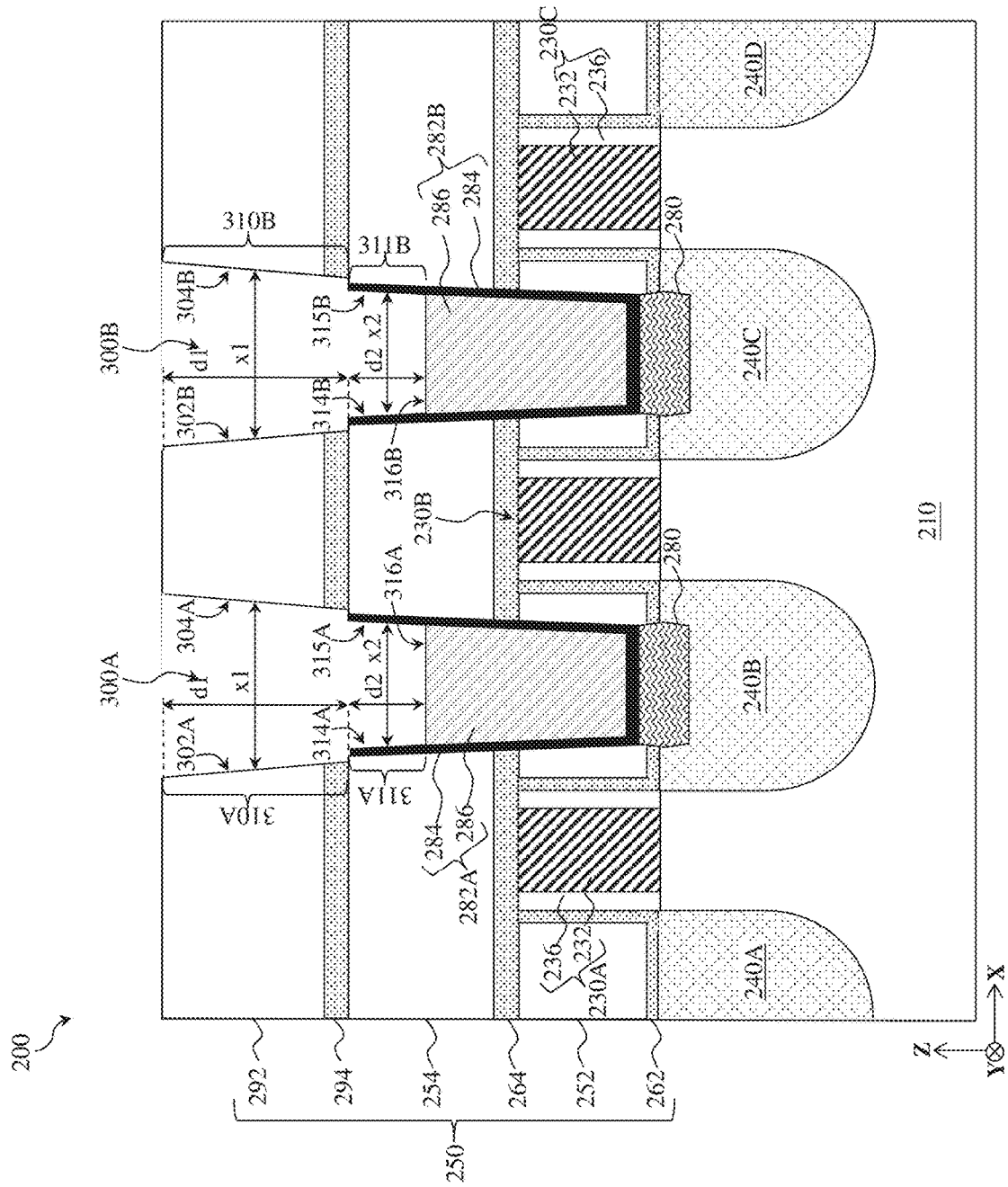
Figures 7B, 7C:
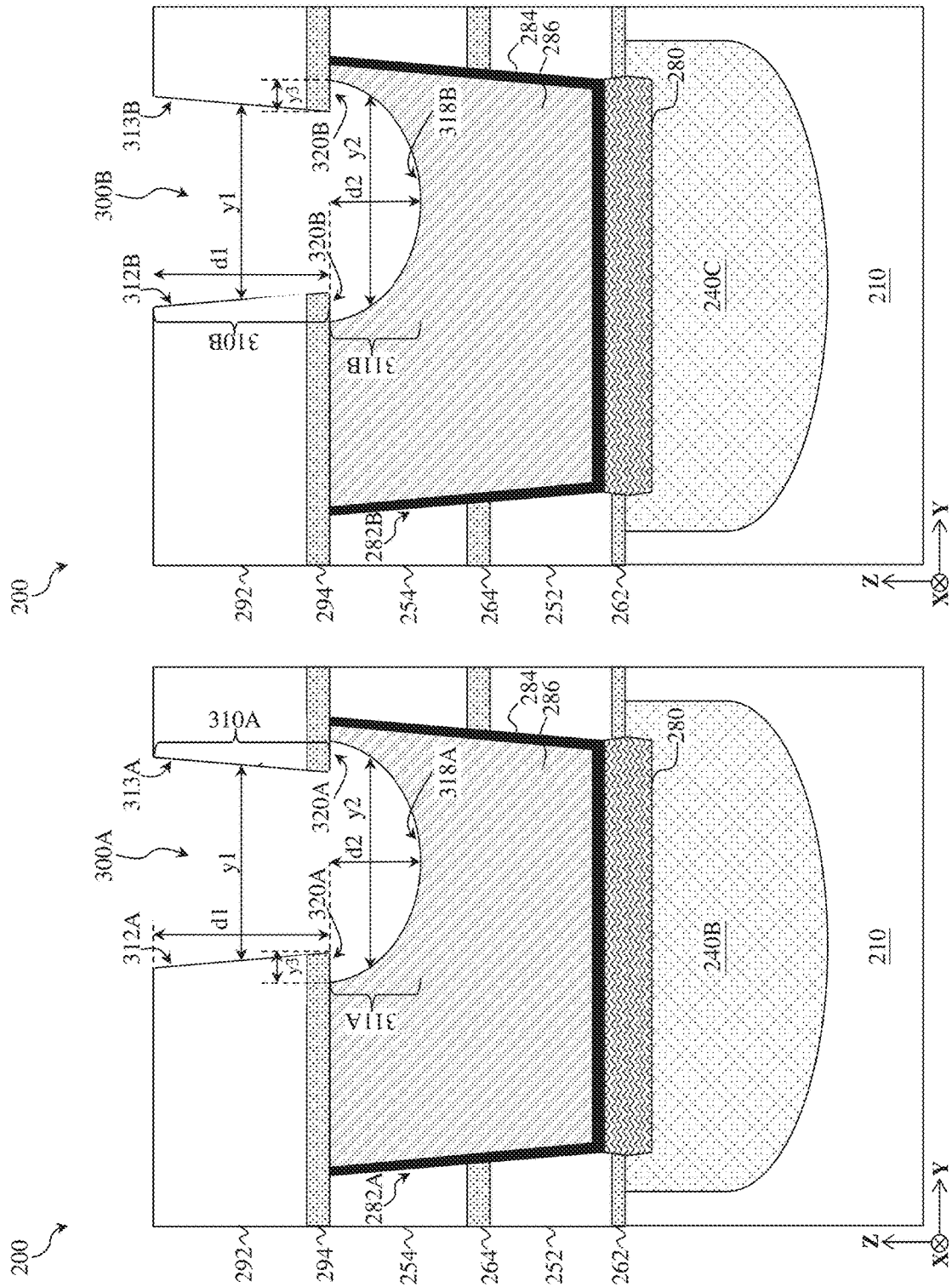

Turning to FIGS. 7A-7C, an etching process is performed to recess source/drain contacts 282A, 282B. Such process can be referred to as a contact etch back, a contact recess, and/or a plug recess (or etch back). The etching process is a dry etching process, a wet etching process, other suitable etching process, or combinations thereof. In the depicted embodiment, the contact etch back is a wet etch that utilizes a wet etchant solution for removing the material of source/drain contacts 282A, 282B (e.g., metal material) at a higher rate than the material of ILD layer 292 (e.g., dielectric material, such as silicon-and-oxygen containing material) and the material of CESL 294 (e.g., dielectric material, such as silicon-and-nitrogen containing material) (i.e., the etchant has a high etch selectivity with respect to source/drain contacts 282A, 282B). In the depicted embodiment, the wet etchant solution removes the material of contact bulk layer 286 at a higher rate than the material of contact barrier layer 284 (i.e., the etchant has a high etch selectivity with respect to contact bulk layer 286), such that the contact etch back removes contact bulk layer 286 but does not remove or substantially remove contact barrier layer 284. For example, the wet etching process implements a wet etchant solution that includes hydrofluoric acid (HF), nitric acid (HNO$_3$), hydrochloric acid (HCl), ammonia (NH$_4$OH), hydrogen peroxide (H$_2$O$_2$), water (H$_2$O), other suitable wet etchant solution constituents, or combinations thereof. In some embodiments, a pH of the wet etchant solution, an etch temperature, and/or an etch time may be tuned to achieve desired etch selectivity. In some embodiments, the wet etchant solution has a pH of about 5.5 to about 8.5. In some embodiments, a temperature of the wet etchant solution is about 18° C. to about 100° C. In some embodiments, a duration of the wet etch is about 10 seconds to about 200 seconds. As described further below, the contact etch back increases a contact area between source/drain contacts 282A, 282B and subsequently formed vias, which can improve performance of IC device 200 and/or improve structural integrity of the vias and/or interconnect structures including the vias. In some embodiments, the contact etch back partially removes contact barrier layer 284, such that a thickness of contact barrier layer 284 varies along ILD layer 254. In some embodiments, the contact etch back completely removes contact barrier layer 284.

After the contact etch back, interconnect opening 300A has an upper portion 310A and a lower portion 311A, and interconnect opening 300B has an upper portion 310B and a lower portion 311B. Upper portions 310A, 310B are configured substantially the same in the X-Z plane and the Y-Z plane. For example, in the X-Z plane, upper portions 310A, 310B are defined between sidewalls 302A, 302B and sidewalls 304A, 304B, respectively, and have width x1 and depth d1 as described above. In the Y-Z plane, upper portions 310A, 310B have a width y1 defined between sidewalls 312A, 312B and sidewalls 313A, 313B, respectively, and depth d1 defined between a top surface of ILD layer 292 and a bottom surface of CESL 294. Sidewalls 312A, 312B and sidewalls 313A, 313B are defined by ILD layer 292 and CESL 294. In some embodiments, width y1 is substantially the same as width x1 (for example, about 10 nm to about 30 nm). In some embodiments, width y1 is greater than or less than width x1. Upper portions 310A, 310B also have a trapezoidal shape in the Y-Z plane, though the present disclosure contemplates upper portions 310A, 310B have other shapes, such as a rectangular shape. Sidewalls 312A, 312B and sidewalls 313A, 313B are tapered, such that bottom widths of upper portions 310A, 310B are less than top widths of upper portions 310A, 310B. Width y2 thus decreases along the z-direction from top widths to bottom widths of upper portions 310A, 310B. The present disclosure contemplates embodiments where upper portions 310A, 310B are configured differently in the X-Z plane and the Y-Z plane.

Lower portions 311A, 311B are configured differently in the X-Z plane and the Y-Z plane. For example, lower portions 311A, 311B have a trapezoidal shape in the X-Z plane (FIG. 7A) and a semi-circle shape in the Y-Z plane (FIG. 7B and FIG. 7C), though the present disclosure contemplates lower portions 311A, 311B having other shapes in the X-Z plane and the Y-Z plane, respectively. In FIG. 7A, lower portion 311A is defined by a sidewall 314A (defined by contact barrier layer 284), a sidewall 315A (defined by contact barrier layer 284), and a bottom 316A (defined by contact bulk layer 286) that extends between sidewall 314A and sidewall 315A; and lower portion 311B is defined by a sidewall 314B (defined by contact barrier layer 284), a sidewall 315B (defined by contact barrier layer 284), and a bottom 316B (defined by contact bulk layer 286) that extends between sidewall 314B and sidewall 315B. A width x2 is defined between sidewalls 314A, 314B and sidewalls 315A, 315B, respectively. In the depicted embodiment, because the contact etch back selectively removes contact bulk layer 286 relative to contact barrier layer 284, width x2 is less than width x1. In some embodiments, width x2 is about 8 nm to about 30 nm. In some embodiments, width x2 is greater than or substantially the same as width x1. Sidewalls 314A, 314B and sidewalls 315A, 315B are tapered, such that bottom widths of lower portions 311A, 311B are less than top widths of lower portions 311A, 311B. Width x2 thus decreases along the z-direction from top widths to bottom widths of lower portions 311A, 311B. A depth d2 is defined between a top surface of ILD layer 254 and bottoms 316A, 316B, respectively. In some embodiments, depth d2 is less than depth d1. In some embodiments, depth d2 is less than or equal to about 30 nm.

In FIG. 7B and FIG. 7C, lower portions 311A, 311B further include curved walls 318A, 318B (defined by contact bulk layer 286), respectively. Depth d2 is further defined between the top surface of ILD layer 254 and curved sidewalls 318A, 318B, respectively, in the Y-Z plane. Accordingly, in the depicted embodiment, depth d2 is substantially the same along the x-direction but varies along the y-direction. A width y2 is also defined by curved sidewalls 318A, 318B, respectively. In the depicted embodiment, because the contact etch back has an isotropic nature (in other words, the contact etch back removes portions of contact bulk layer 286 laterally (e.g., along the x-direction and the y-direction) and vertically (e.g., along the z-direction)), top widths of lower portions 311A, 311B are greater than bottom widths of upper portions 310A, 310B. For example, width y2 is greater than width y1. In some embodiments, width y2 is about 10 nm to about 50 nm. In some embodiments, width y2 is about 10 nm to about 20 nm greater than width y1. In some embodiments, the contact etch back exposes a portion of a bottom surface of CESL 294, such as CESL surfaces 320A and CESL surfaces 320B. In some embodiments, a width y3 of exposed CESL surfaces 320A, 320B is less than or equal to about 10 nm. Curved sidewalls 318A, 318B also result in lower portions 311A, 311B having tapered widths in the Y-Z plane, such that width y2 decreases along the z-direction from tops to bottoms of lower portions 311A, 311B.

Figure 8A:
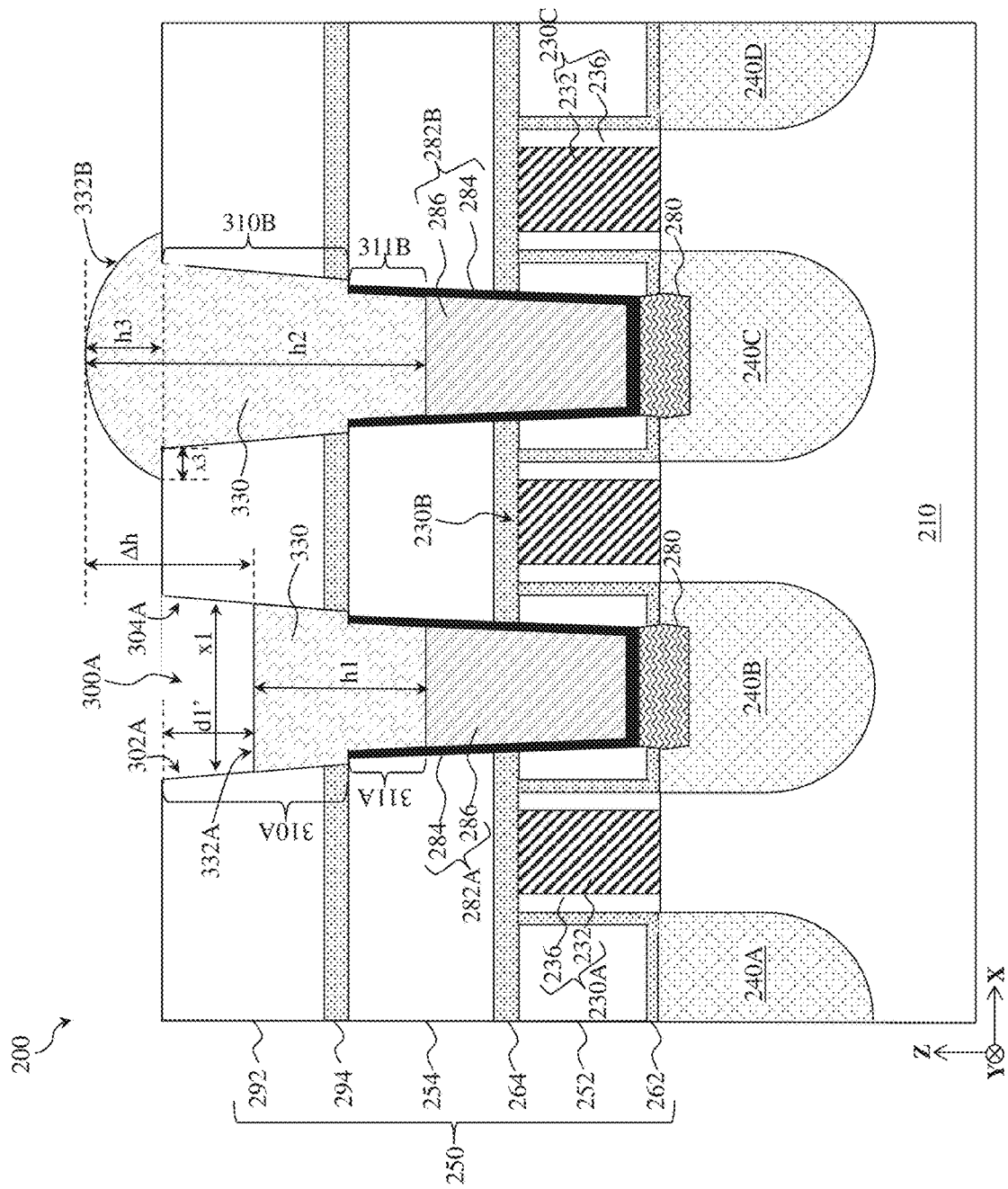
Figures 8B, 8C:
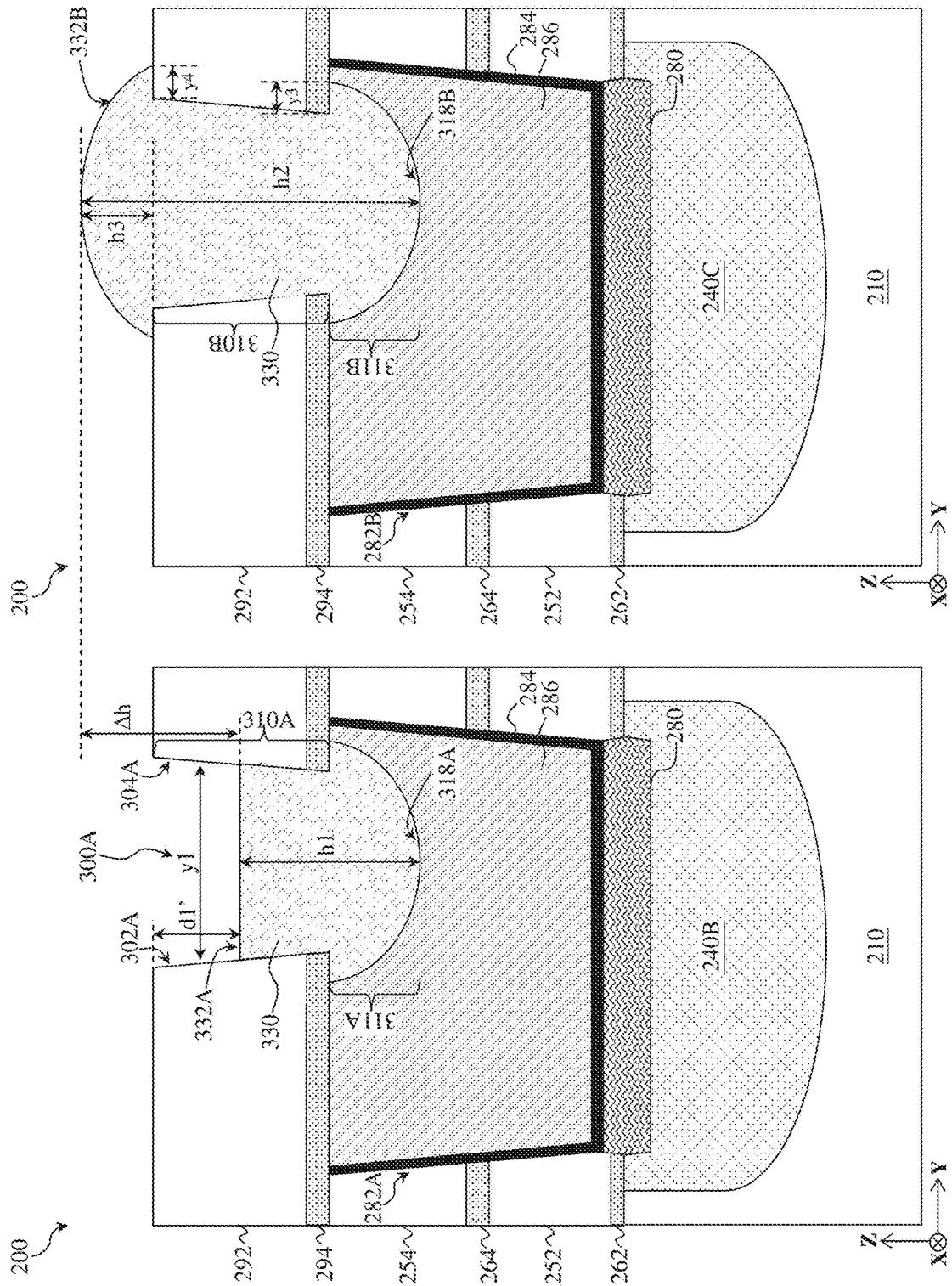

Turning to FIGS. 8A-8C, a via bulk material 330 is formed in interconnect openings 300A, 300B by a bottom-up deposition process. Via bulk material 330 includes tungsten, tungsten alloy, ruthenium, ruthenium alloy, cobalt, cobalt alloy, copper, copper alloy, aluminum, aluminum alloy, iridium, iridium alloy, palladium, palladium alloy, platinum, platinum alloy, nickel, nickel alloy, other low resistivity metal constituent and/or alloys thereof, or combinations thereof. Bottom-up deposition process generally refers to a deposition process that fills an opening from bottom to top (which can also be referred to as a bottom-up fill of an opening). In some embodiments, the bottom-up deposition process is selective CVD, where various parameters of the selective CVD are tuned to selectively grow tungsten, ruthenium, cobalt, or alloys thereof from contact bulk layer 286 and/or contact barrier layer 284 while limiting (or preventing) growth of tungsten, ruthenium, cobalt, or alloys thereof from ILD layer 292 and/or CESL 294. The various parameters include deposition precursors (for example, metal precursors and/or reactants), deposition precursor flow rates, deposition temperature, deposition time, deposition pressure, other suitable deposition parameters, or combinations thereof. In the depicted embodiment, various parameters of the selective CVD are tuned to selectively grow polycrystalline tungsten on contact bulk layer 286 using a reduction reaction. In such embodiments, the selective CVD includes flowing a tungsten-containing precursor (for example, $WF_x$ (where x indicates a number of F atoms and $x \geq 1$), $WCl_y$ (where y indicates a number of Cl atoms and $y \geq 1$), other suitable tungsten-containing gas, or combinations thereof) and a reactant precursor (for example, $H_2$, other suitable reactant gas, or combinations thereof) into a process chamber to deposit via bulk material 330 on contact bulk layer 286 in interconnect openings 300A, 300B. In some embodiments, a carrier gas is used to deliver the tungsten-containing precursor gas and/or the reactant gas to the process chamber. The carrier gas may be an inert gas, such as an argon-containing gas, a helium-containing gas, a xenon-containing gas, other suitable inert gas, or combinations thereof. In some embodiments, where the tungsten-containing precursor is tungsten hexafluoride (e.g., $WF_6$), tungsten hexafluoride can be reduced by $H_2$ as provided for in the following example reduction reaction:

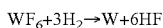

In some embodiments, where the tungsten-containing precursor is tungsten pentachloride (e.g., $WCl_5$), tungsten pentachloride can be reduced by $H_2$ as provided in the following example reduction reaction:

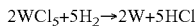

In some embodiments, the tungsten-containing precursor is mixed with the reactant gas (e.g., $H_2$) and a ratio of the tungsten-containing precursor to the reactant gas is about 0.1% to about 1.5%. In some embodiments, a pressure maintained in the process chamber during the selective CVD is about 1 Torr to about 50 Torr. In some embodiments, a temperature of IC device 200 (for example, substrate 210) during the selective CVD is about 200° C. to about 400° C. In some embodiments, the various parameters of the bottom-up deposition process are tuned to minimize variations in via bulk material 330 in interconnect openings across IC device 200, such as those described below and herein. In some embodiments, the bottom-up deposition process is ALD, where various parameters of the ALD are tuned to selectively grow tungsten, ruthenium, cobalt, or alloys thereof from contact bulk layer 286 and/or contact barrier layer 284 while limiting (or preventing) growth of tungsten, ruthenium, cobalt, or alloys thereof from ILD layer 292 and/or CESL 294. In some embodiments, multiple ALD cycles are performed to form via bulk material 330. In some embodiments, the bottom-up deposition process is multiple cycles of deposition/etch steps including, for example, depositing a via bulk material over IC device 200 and then etching back the via bulk material successively.

As depicted in FIGS. 8A-8C, bottom-up deposition process may not uniformly deposit via bulk material 330 in interconnect openings, such as interconnect opening 300A and interconnect opening 300B, across IC device 200. For example, via bulk material 330 partially fills interconnect opening 300A while completely filling interconnect opening 300B. In the depicted embodiment, via bulk material 330 completely fills lower portions 311A, 311B, partially fills upper portion 310A, and completely fills upper portion 310B. As such, via bulk material 330 filling interconnect opening 300A has a height (or thickness) h1 defined between source/drain contact 282A (in particular, top surface of contact bulk layer 286) and a top surface 332A of via bulk material 330, and via bulk material 330 filling interconnect opening 300B has a height (or thickness) h2 defined between source/drain contact 282B (in particular, top surface of contact bulk layer 286) and a top surface 332B of via bulk material 330. In some embodiments, height h1 is about 20 nm to about 50 nm, and height h2 is about 40 nm to about 130 nm. In some embodiments, a ratio of height h1 to height h2 is about 1:2 to about 1:7. In some embodiments, a height (growth) variation Δh between via bulk material 330 deposited (grown) in interconnect openings of IC device 200, such as interconnect openings 300A, 300B, is about 20 nm to about 80 nm. In the depicted embodiment, top surface 332A and top surface 332B have different surface profiles. For example, top surface 332A is a substantially planar surface and top surface 332B is a substantially curved surface, though the present disclosure notes that both the planar surface and the curved surface may include irregularities and/or roughness that naturally arise from the bottom-up deposition process (i.e., the planar surface and the curved surface may not be completely smooth as depicted). In some embodiments, top surface 332A and top surface 332B are substantially planar surfaces or substantially curved surfaces. In some embodiments, top surface 332A is a substantially curved surface, while top surface 332B is a substantially planar surface. A remaining (unfilled) portion of interconnect opening 300A has a depth d1', which is defined between a top surface of ILD layer 292 and top surface 332A of via bulk material 330. In some embodiments, depth d1' is less than about 30 nm. Depth d1' is less than depth d1, which reduces an aspect ratio of interconnect openings 300A, 300B. In some embodiments, after the bottom-up deposition process, an aspect ratio (e.g., d1'/x1) of interconnect openings 300A, 300B is less than about 5, and in some embodiments, less than about 3. Reducing the aspect ratio of interconnect openings 300A, 300B can prevent or minimize formation of gaps within interconnects formed in interconnect openings 300A, 300B. In the depicted embodiment, via bulk material 330 overfills interconnect opening 300B and extends over and above top surface of ILD layer 292. For example, a portion of via bulk material 330 forms a via rivet head having a height (or thickness) h3 defined between the top surface of ILD layer 292 and top surface 332B of via bulk material 330. In some embodiments, height h3 is about 5 nm to about 20 nm. Via rivet head has a width that is greater than width y1. In the depicted embodiment, via bulk material 330 of via rivet head extends over the top surface of ILD layer 292. In such embodiments, a width y4 of a portion of the top surface of ILD layer 292 covered by via bulk material 330 is about 5 nm to about 15 nm. In some embodiments, width y4 is greater than width y3, such as depicted. In some embodiments, width y4 is less than or substantially equal to width y3. As height h3 of the via rivet head increases, internal stress increases within via bulk material 330, which can lead to cracks during continual growth of via bulk material 330 and/or during subsequent processing. Accordingly, in some embodiments, the bottom-up deposition process is tuned to constrain height h3 to a predefined height that can minimize internal stress of via bulk material 330 while also ensuring that height h1 is sufficient to reduce an aspect ratio of interconnect openings 300A, 300B within a range that enhances metal gap filling. For example, in some embodiments, the bottom-up deposition process is tuned to ensure that height h3 is less than or equal to 20 nm to minimize internal stress of via bulk material 330 while height h1 is within a target height range that achieves depth d1' less than about 30 nm to provide interconnect openings 300A, 300B with aspect ratios having improved metal gap filling characteristics. In such example, when height h3 is greater than 20 nm, via bulk material 330 may exhibit degrees of internal stress that lead to cracks in via bulk material 330 that can negatively impact performance of IC device 200.

Figure 9A:
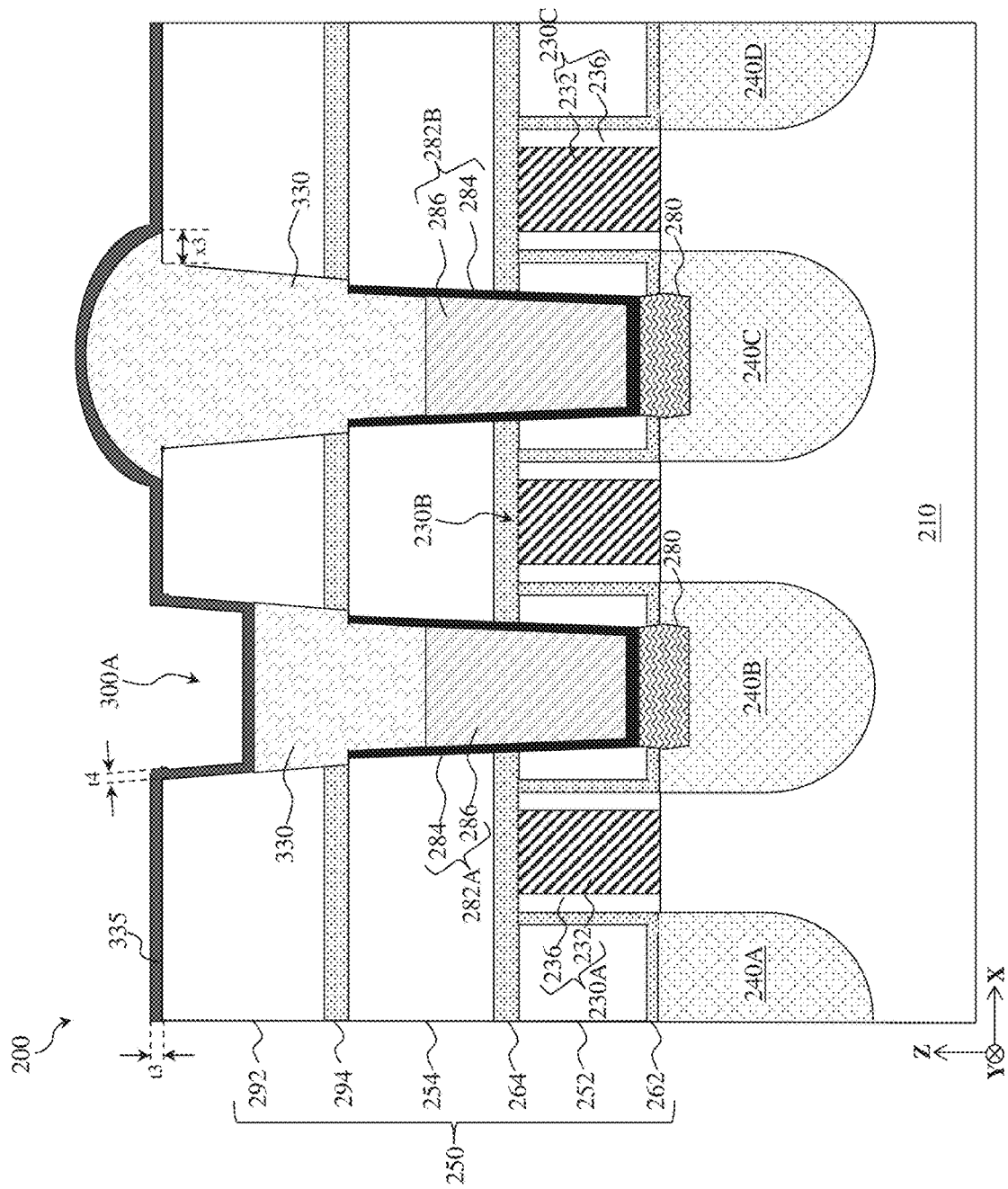
Figures 9B, 9C:
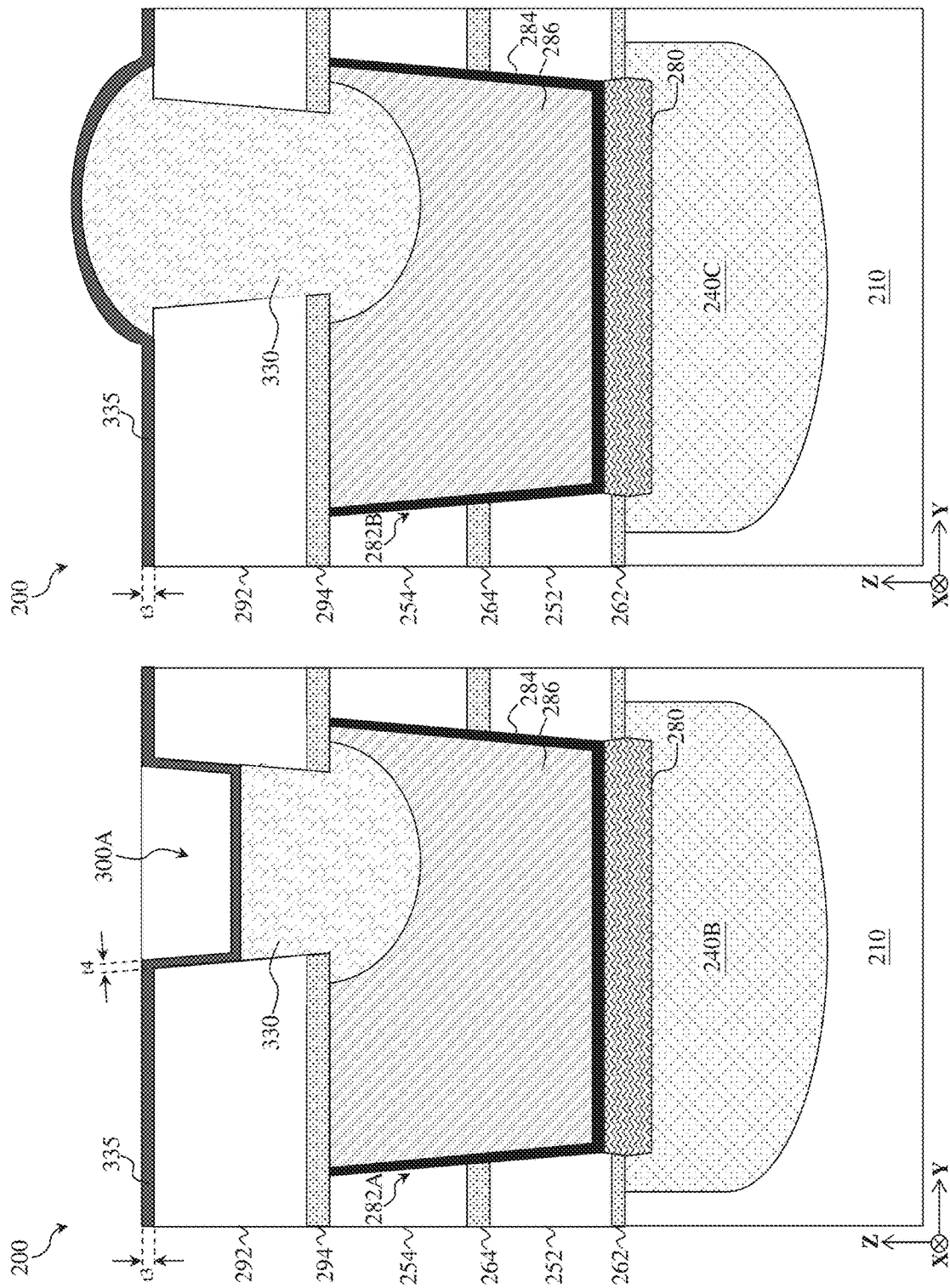

Turning to FIGS. 9A-9C, a via barrier layer 335 (also referred to as a via liner layer) is formed over via bulk material 330. Via barrier layer 335 is formed over the top surface of ILD layer 292, top surfaces 332A, 332B of via bulk material 330, and sidewalls 302A, 304A defining a remainder of upper portion 310A. Via barrier layer 335 is formed in and partially fills interconnect opening 300A. As deposited, via barrier layer 335 floats above source/drain contact 282A within interconnect opening 300A and does not physically contact source/drain contact 282A. In the depicted embodiment, via barrier layer 335 has a thickness t3 over the top surface of ILD layer 292 and top surfaces 332A, 332B of via bulk material 330, and a thickness t4 over sidewalls 302A, 304A defining a remainder of upper portion 310A. In the depicted embodiment, thickness t3 is greater than thickness t4. For example, thickness t3 is about 4 nm to about 8 nm, and thickness t4 is about 1 nm to about 3 nm. Thickness t4 greater than about 3 nm may leave insufficient room for a subsequently formed via bulk material, which can lead to gap filling issues (for example, voids within the vias). In some embodiments, via barrier layer 335 is conformally deposited over IC device 200, such that thickness t3 is substantially the same as thickness t4. In some embodiments, thickness t3 is less than thickness t4 depending on process conditions. In some embodiments, via barrier layer 335 is formed over via bulk material 330 to reduce internal stress and prevent cracks in via bulk material 330. In some embodiments, via bulk material 330 may completely fill both interconnect openings 300A, 300B (and, in some embodiments, all interconnect openings across a wafer). In such embodiments, via barrier layer 335 (and subsequently formed via bulk material described below) may still be formed to reduce internal stress and prevent cracks in via bulk material 330, for example, during a planarization process. Via barrier layer 335 includes a material that promotes adhesion between a dielectric material (here, ILD layer 292) and a subsequently formed metal material for filling a remainder of interconnect opening 300A. For example, via barrier layer 335 includes titanium, titanium alloy, tantalum, tantalum alloy, cobalt, cobalt alloy, ruthenium, ruthenium alloy, molybdenum, molybdenum alloy, tungsten, tungsten alloy, other suitable constituent configured to promote and/or enhance adhesion between a metal material and a dielectric material, or combinations thereof. In the depicted embodiment, via barrier layer 335 includes tantalum and nitrogen (for example, tantalum nitride), titanium and nitrogen (for example, titanium nitride), tungsten and nitrogen (for example, tungsten nitride), or tungsten. In some embodiments, via barrier layer 335 includes multiple layers. For example, via barrier layer 335 includes a first sub-layer that includes titanium and a second sub-layer that includes titanium nitride disposed over the first sub-layer. In another example, via barrier layer 335 includes a first sub-layer that includes tantalum and a second sub-layer that includes tantalum nitride.

Via barrier layer 335 is deposited by PVD, CVD, ALD, electroplating, electroless plating, other suitable deposition process, or combinations thereof. In some embodiments, via barrier layer 335 is a titanium nitride layer formed by performing PVD to deposit a titanium layer over IC device 200 and then performing a nitrogen plasma treatment on the titanium layer. In some embodiments, a pressure maintained in a process chamber during the PVD is about 10 mTorr to about 1 Torr. In some embodiments, a temperature maintained in the process chamber during the PVD is about 300° C. to about 450° C. In some embodiments, the PVD is a radio frequency (RF) sputtering process. In such embodiments, the RF sputtering process may implement an RF power of about 1 kilowatt (kW) to about 2 kW. In some embodiments, the nitrogen plasma treatment includes exposing the titanium layer to a nitrogen-containing plasma (i.e., the titanium layer is bombarded with plasma-excited nitrogen-containing species to drive nitrogen into the titanium layer). In some embodiments, via barrier layer 335 includes a titanium nitride layer disposed over a titanium layer, where the titanium layer is formed by performing PVD and the titanium nitride layer is formed by performing CVD. In some embodiments, a pressure maintained in a process chamber during the PVD is about 10 mTorr to about 150 mTorr. In some embodiments, a temperature maintained in the process chamber during the PVD is about 400° C. to about 500° C. In embodiments where the PVD is an RF sputtering process, the PVD can implement an RF power of about 3 kW to about 5 kW. In some embodiments, the CVD implements a titanium-containing precursor, such as tetrakis (dimethylamino)titanium (TDMAT). In some embodiments, a pressure maintained in a process chamber during the CVD is about 1 Torr to about 5 Torr. In some embodiments, a temperature maintained in the process chamber during the CVD is about 100° C. to about 500° C. In some embodiments, via barrier layer 335 includes a tungsten-comprising layer formed by CVD, where the CVD implements a tungsten-containing precursor, such as tungsten hexacarbonyl ($W(CO)_6$). In some embodiments, the CVD process implements a mixture of the tungsten-containing precursor with hydrogen ($H_2$), silane ($SiH_4$), and/or borane (for example, diborane ($B_2H_6$)).

Figure 10A:
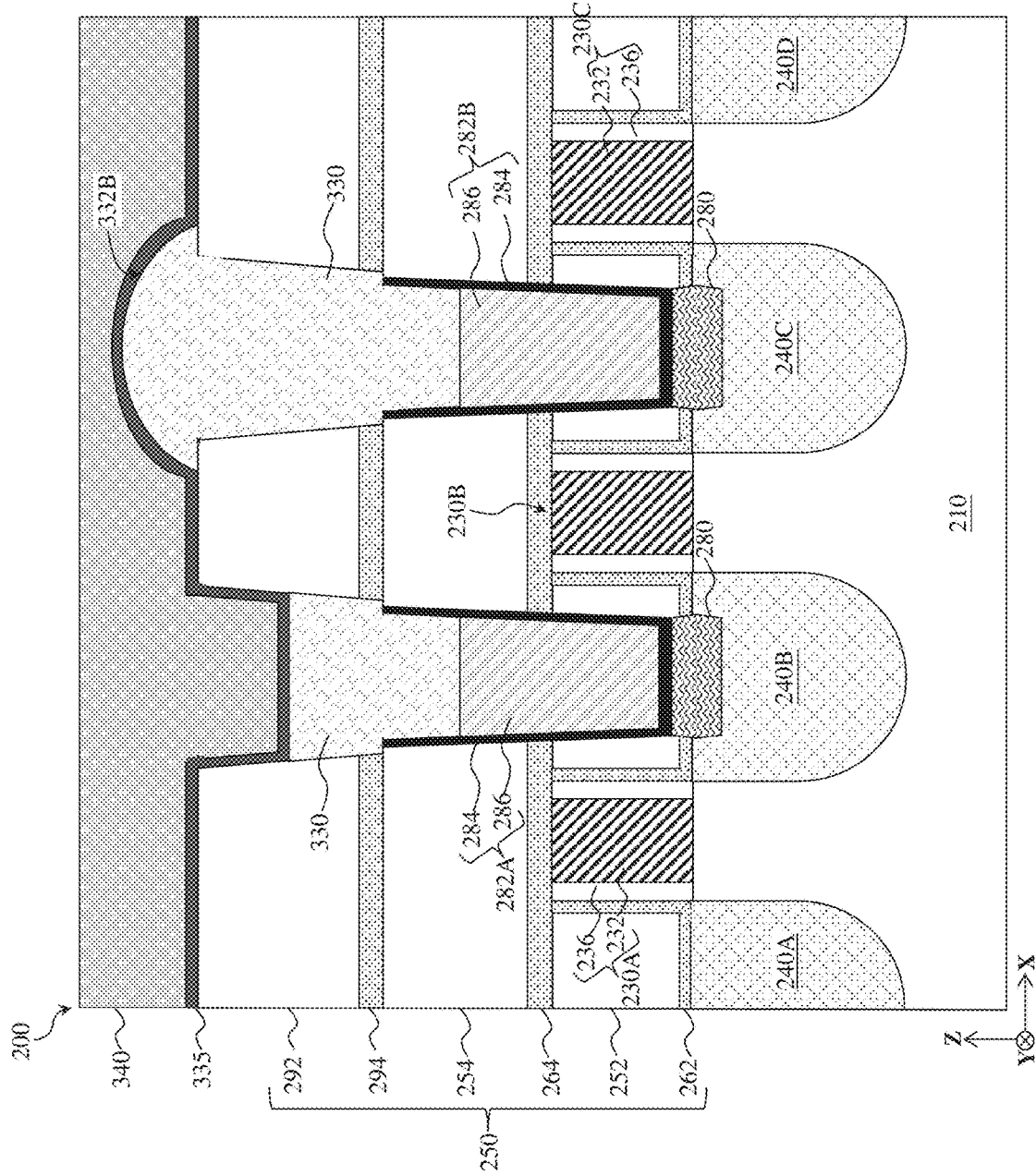

Turning to FIGS. 10A-10C, a via bulk material 340 is formed over via barrier layer 335. Via bulk material 340 is formed in and fills a remainder of upper portion 310A of interconnect opening 300A. In the depicted embodiment, via bulk material 340 is disposed over and covers the top surface of ILD layer 292 and top surface 332B of via bulk material 330. In some embodiments, via bulk material 340 does not cover or only partially covers top surface 332B depending on a thickness of via bulk material 340. Via bulk material 340 includes tungsten, tungsten alloy, ruthenium, ruthenium alloy, cobalt, cobalt alloy, copper, copper alloy, aluminum, aluminum alloy, iridium, iridium alloy, palladium, palladium alloy, platinum, platinum alloy, nickel, nickel alloy, other low resistivity metal constituent and/or alloys thereof, or combinations thereof. In the depicted embodiment, via bulk material 340 and via bulk material 330 include the same metal. For example, via bulk material 340 and via bulk material 330 include tungsten. In some embodiments, via bulk material 340 and via bulk material 330 include different metals. In the depicted embodiment, via bulk material 340 and via bulk material 330 are formed by different processes. For example, a blanket deposition process, such as blanket CVD, is performed to deposit via bulk material 340 over via barrier layer 335. The blanket deposition process deposits via bulk material 340 over an entirety of exposed surfaces of IC device 200. In some embodiments, the blanket CVD includes flowing a tungsten-containing precursor (for example, $WF_6$ or $WCl_5$) and a reactant precursor (for example, $H_2$, other suitable reactant gas, or combinations thereof)) into a process chamber. In some embodiments, a carrier gas is used to deliver the tungsten-containing precursor gas and/or the reactant gas to the process chamber. The carrier gas may be an inert gas, such as an argon-containing gas, a helium-containing gas, a xenon-containing gas, other suitable inert gas, or combinations thereof. In some embodiments, a pressure maintained in a process chamber during the blanket CVD is about 1 Torr to about 500 Torr. In some embodiments, a temperature maintained in the process chamber during the blanket CVD is about 200° C. to about 400° C. In some embodiments, the blanket deposition process is PVD, ALD, electroplating, electroless plating, other suitable deposition process, or combinations thereof.

Figure 11A:
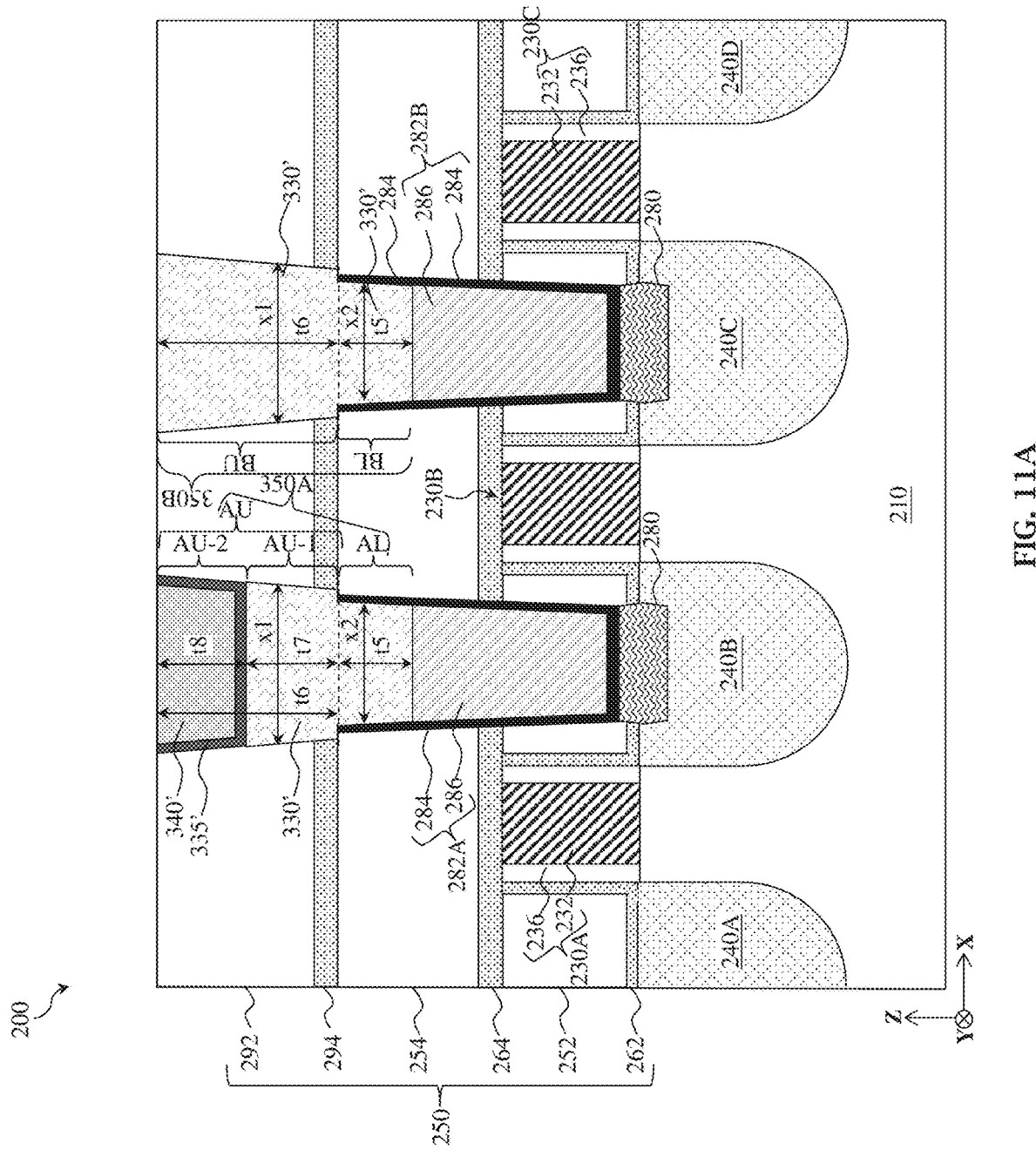
Figure 11B:
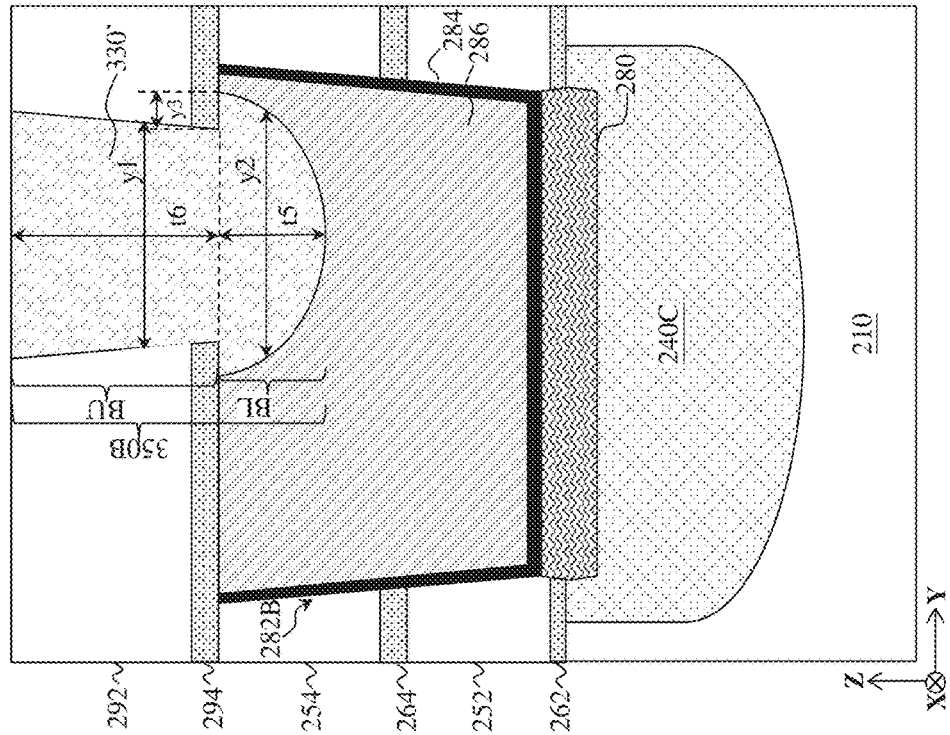
Figure 11C:
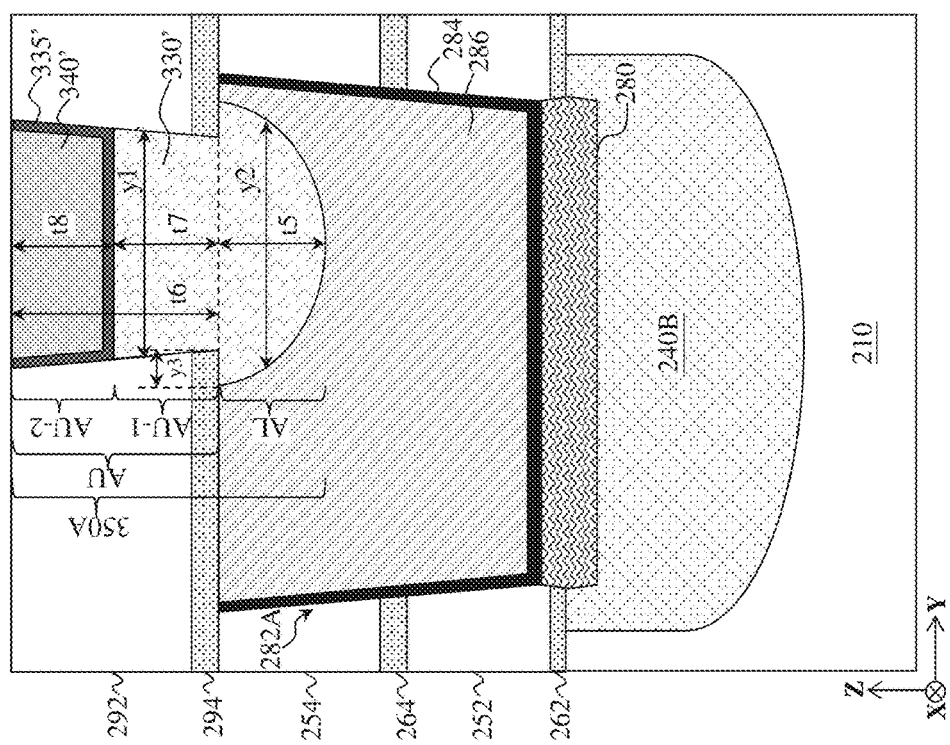

Turning to FIGS. 11A-11C, a CMP process and/or other planarization process is performed to remove excess via bulk material 340, via barrier layer 335, and via bulk material 330 (such as that disposed over the top surface of ILD layer 292), resulting in a via 350A and a via 350B of MLI feature 250. Via 350A electrically couples and/or physically couples source/drain contact 282A to a conductive feature of MLI feature 250, such as a first conductive line of a metal layer of MLI feature 250 (for example, a metal one (M1) layer), and via 350B electrically couples and/or physically couples source/drain contact 282B to a conductive feature of MLI feature 250, such as a second conductive line of a metal layer of MLI feature 250 (for example, the M1 layer). Vias 350A, 350B can thus be referred to as vias-to-contacts. The CMP process can planarize top surfaces of vias 350A, 350B, such that the top surface of ILD layer 292 and the top surfaces of vias 350A, 350B are substantially planar surfaces. Vias 350A, 350B include via bulk material 340, via barrier layer 335, and/or via bulk material 330 that remains in interconnect openings 300A, 300B after the planarization process, which are referred to respectively as a via bulk layer 340', a via barrier layer 335', and a via bulk layer 330'. Via 350A has a lower via portion AL and an upper via portion AU, and via 350B has a lower via portion BL and an upper via portion BU. Lower via portions AL, BL extend into source/drain contacts 282A, 282B, respectively. In particular, lower via portions AL, BL extend from the top surface of ILD layer 254 to the top surface of contact bulk layer 286 of source/drain contacts 282A, 282B, respectively. Lower via portions AL, BL have width x2 along the x-direction, width y2 along the y-direction, and a thickness t5 along the z-direction. In the depicted embodiment, thickness t5 is about equal to depth d2 (for example, thickness t5 is less than or equal to about 10 nm). Upper via portions AU, BU extend through ILD layer 292 and CESL 294, for example, from the top surface of ILD layer 292 to the top surface of ILD layer 254. Upper via portions AU, BU have width x1 along the x-direction, width y1 along the y-direction, and a thickness t6 along the z-direction. In the depicted embodiment, thickness t6 is about equal to depth d1 (for example, thickness t6 is about 20 nm to about 80 nm). In the depicted embodiment, in the X-Z plane, a width of lower via portions AL, BL is less than a width of upper via portions AU, BU (i.e., width x2 is less than x1), and in the Y-Z plane, a width of lower via portions AL, BL is greater than a width of upper via portions AU, BU (i.e., width y2 is greater than width y1). In some embodiments, the width of lower via portions AL, BL is greater than or about equal to the width of upper via portions AU, BU in the X-Z plane. In some embodiments, the width of lower via portions AL, BL is less than or about equal to the width of upper via portions AU, BU in the Y-Z plane.

Lower via portion AL and lower via portion BL are substantially the same. For example, each of lower via portions AL, BL include a lower portion of via bulk layer 330' that physically contacts contact barrier layer 284 and contact bulk layer 286 of source/drain contacts 282A, 282B, respectively. In the X-Z plane, the lower portions of via bulk layer 330' have tapered, substantially planar side surfaces that interface with contact barrier layer 284 of source/drain contacts 282A, 282B, respectively, and substantially planar bottom surfaces that interface with contact bulk layer 286 of source/drain contacts 282A, 282B, respectively. Contact barrier layer 284 separates the tapered, substantially planar side surfaces of the lower portions of via bulk layer 330' from ILD layer 254. In the Y-Z plane, the lower portions of via bulk layer 330' have substantially curved surfaces that interface with contact bulk layer 286 of source/drain contacts 282A, 282B, respectively. Contact bulk layer 286 and contact barrier layer 284 separate the substantially curved surfaces of the lower portions of via bulk layer 330' from ILD layer 254. Lower via portions AL, BL increase a contact area between vias 350A, 350B and source/drain contacts 282A, 282B, which reduces resistance between vias 350A, 350B and source/drain contacts 282A, 282B, thereby improving overall performance of IC device 200. For example, instead of vias 350A, 350B having a single interface, for example, between bottom surfaces of vias 350A, 350B and top surfaces of source/drain contacts 282A, 282B, respectively, lower via portions AL, BL are surrounded by source/drain contacts 282A, 282B, respectively, and have multiple interfaces (for example, bottom interfaces and sidewall interfaces) with source/drain contacts 282A, 282B, respectively. Increased contact area provided by lower via portions AL, BL also improves mechanical strength, and thus structural stability, of vias 350A, 350B. Further, in the Y-Z plane, portions of via bulk layer 330' that extend under and engage CESL surfaces 320A, 320B, respectively, secure vias 350A, 350B to source/drain contacts 282A, 282B, further improving mechanical strength, and thus structural stability, of vias 350A, 350B.

Because growth (and thus heights) of via bulk material 330 varies in interconnect openings of IC device 200, via bulk layer 330' is positioned randomly within vias of IC device 200, resulting in vias to source/drain contacts having different configurations across IC device 200. For example, in FIGS. 11A-11C, because via bulk material 330 partially filled interconnect opening 300A and completely filled interconnect opening 300B, upper via portion AU of via 350A includes via bulk layer 330', via barrier layer 335', and via bulk layer 340', while upper via portion BU of via 350B includes only via bulk layer 330'. Upper via portion AU can be separated into an upper via portion AU-1 and an upper via portion AU-2. Upper via portion AU-1 is similar to upper via portion BU, except a thickness of upper via portion AU-1 is less than a thickness of upper via portion BU. For example, each of upper via portions AU-1, BU include an upper portion of via bulk layer 330'. The upper portion of via bulk layer 330' has thickness t6 in via 350B, whereas the upper portion of via bulk layer 330' has a thickness t7 that is less than thickness t6 in via 350A. In the X-Z plane and the Y-Z plane, the upper portions of via bulk layer 330' have tapered, substantially planar side surfaces that physically contact and interface with ILD layer 292 and CESL 294. No barrier (or liner) layer thus exists between upper via portions AU-1, BU and a dielectric layer of MLI feature 250 (for example, CESL 294 and ILD layer 292). In the depicted embodiment, via 350B can be referred to as a barrier-free via because no barrier layer is disposed between via bulk layer 330' and ILD layer 292 or CESL 294. In contrast, since upper via portion AU-1 does not have a barrier layer disposed between via bulk layer 330' and ILD layer 292 or CESL 294, but upper via portion AU-2 includes via barrier layer 335' disposed between via bulk layer 340 and ILD 292, via 350A can be referred to as a partial barrier-free via. In FIGS. 11A-11C, via barrier layer 335' is further disposed between via bulk layer 340' and via bulk layer 330', such that via barrier layer 335' floats within via 350A and does not physically contact source/drain contact 282A. Upper via portion AU-2 has a thickness t8 along the z-direction. In the depicted embodiment, thickness t8 is about equal to depth d1' (for example, thickness t8 is about 1 nm to about 50 nm). In some embodiments, a ratio of thickness t8 to width x1 (e.g., t8/x1) of upper via portion AU-2 is less than about 5, and in some embodiments, is less than about 3. Thickness t8 may be greater or less than thickness t7 depending on growth of via bulk material 330.

Figure 17A:
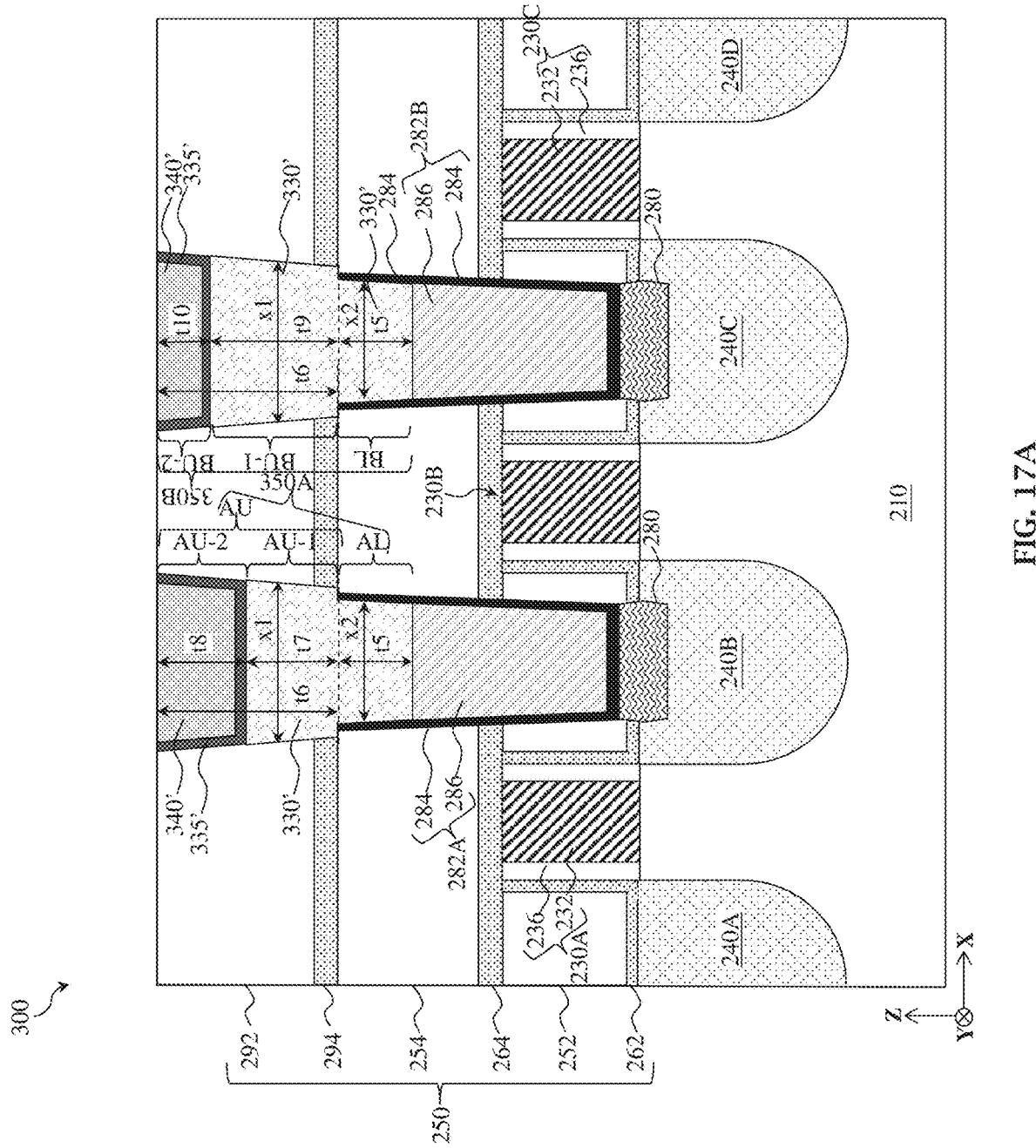
FIGS. 17A-17C are fragmentary diagrammatic views of an integrated circuit device, in portion or entirety, having a multilayer interconnect structure, which can be fabricated by the method of FIG. 1A and FIG. 1B, according to other embodiments of the present disclosure.
Figure 17B:
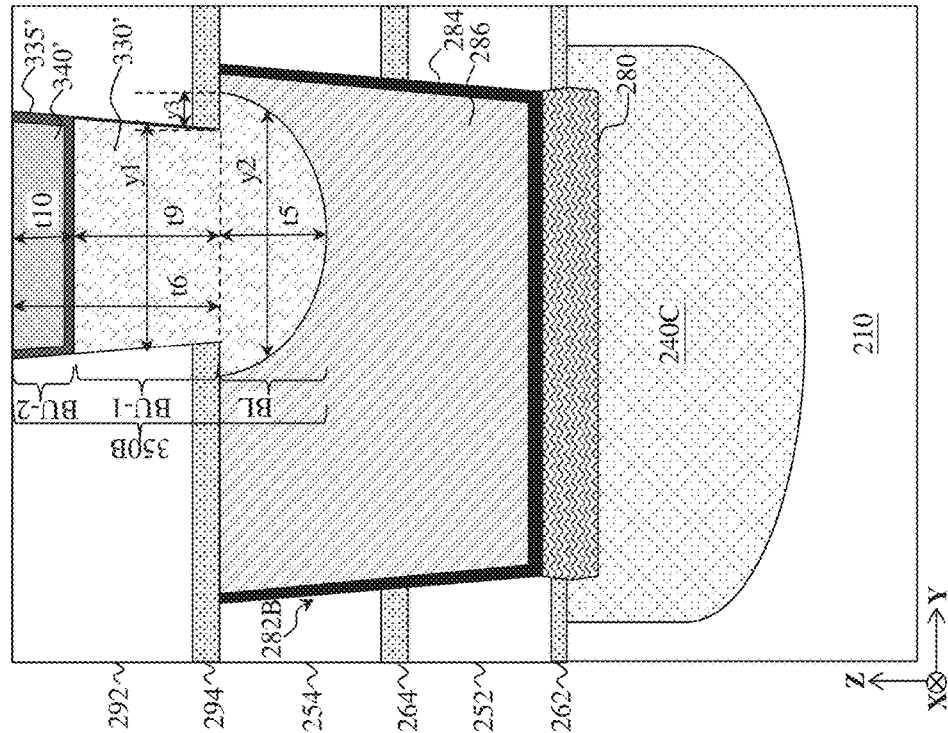
Figure 17C:
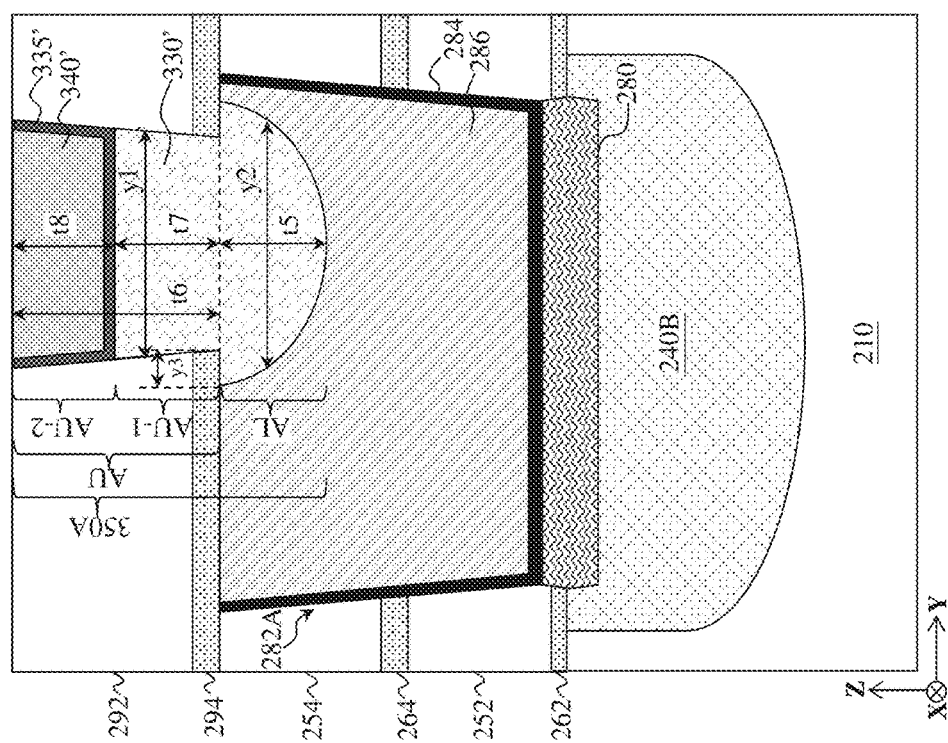

In another example, such as that depicted in FIGS. 17A-17C, because growth (and thus heights) of via bulk material 330 varies in interconnect openings of IC device 200, instead of via bulk material 330 partially filling interconnect opening 300A and completely filling interconnect opening 300B, via bulk material 330 partially fills both interconnect opening 300A and interconnect opening 300B but has different thicknesses. In such embodiments, upper via portion AU of via 350A and upper via portion BU of via 350B each include via bulk layer 330', via barrier layer 335', and via bulk layer 340'. Upper via portion AU can be separated into an upper via portion AU-1 and an upper via portion AU-2, and upper via portion BU can be separated into an upper via portion BU-1 and an upper via portion BU-2. Upper via portion AU-1 is similar to upper via portion BU-1, except a thickness of upper via portion AU-1 is less than a thickness of upper via portion BU-1. For example, each of upper via portions AU-1, BU-1 include an upper portion of via bulk layer 330', but the upper portion of via bulk layer 330' has thickness t9 in via 350B and the upper portion of via bulk layer 330' has thickness t7, which is less than thickness t9. Both thickness t7 and thickness t9 are less than thickness t6 of upper via portions AU, BU. In the X-Z plane and the Y-Z plane, the upper portions of via bulk layer 330' have tapered, substantially planar side surfaces that physically contact and interface with ILD layer 292 and CESL 294. No barrier (or liner) layer thus exists between upper via portions AU-1, BU-1 and a dielectric layer of MLI feature 250 (for example, CESL 294 and ILD layer 292). In the depicted embodiment, since upper via portions AU-1, BU-1 do not have a barrier layer disposed between via bulk layer 330' and ILD layer 292 or CESL 294, but upper via portions AU-2, BU-2 include via barrier layer 335' disposed between via bulk layer 340 and ILD 292, vias 350A, 350B can be referred to as a partial barrier-free via. In FIGS. 17A-17C, via barrier layer 335' is further disposed between via bulk layer 340' and via bulk layer 330', such that via barrier layer 335' floats within via 350A and via 350B and does not physically contact source/drain contacts 282A, 282B. Upper via portion BU-2 has a thickness t10 that is less than thickness t8 of upper via portion AU-2, such that via barrier layer 335' is positioned within via 350A differently than via barrier layer 335' is positioned within via 350B. For example, in the depicted embodiment, a distance between a top surface of substrate 210 and via barrier layer 335' of via 350A (in particular, a bottom surface of via barrier layer 335') is less than a distance between the top surface of substrate 210 and via barrier layer 335' of via 350B (in particular, a bottom surface of via barrier layer 335'). In some embodiments, in FIGS. 17A-17C, a ratio of thickness t8 to width x1 (e.g., t8/x1) of upper via portion AU-2 and a ratio of thickness t10 to width x1 (e.g., t10/x1) of upper via portion BU-2 are each less than about 5, and in some embodiments, is less than about 3. In the depicted embodiment, the ratio of thickness t8 to width x1 is greater than the ratio of thickness t10 to width x1.

Figure 12:
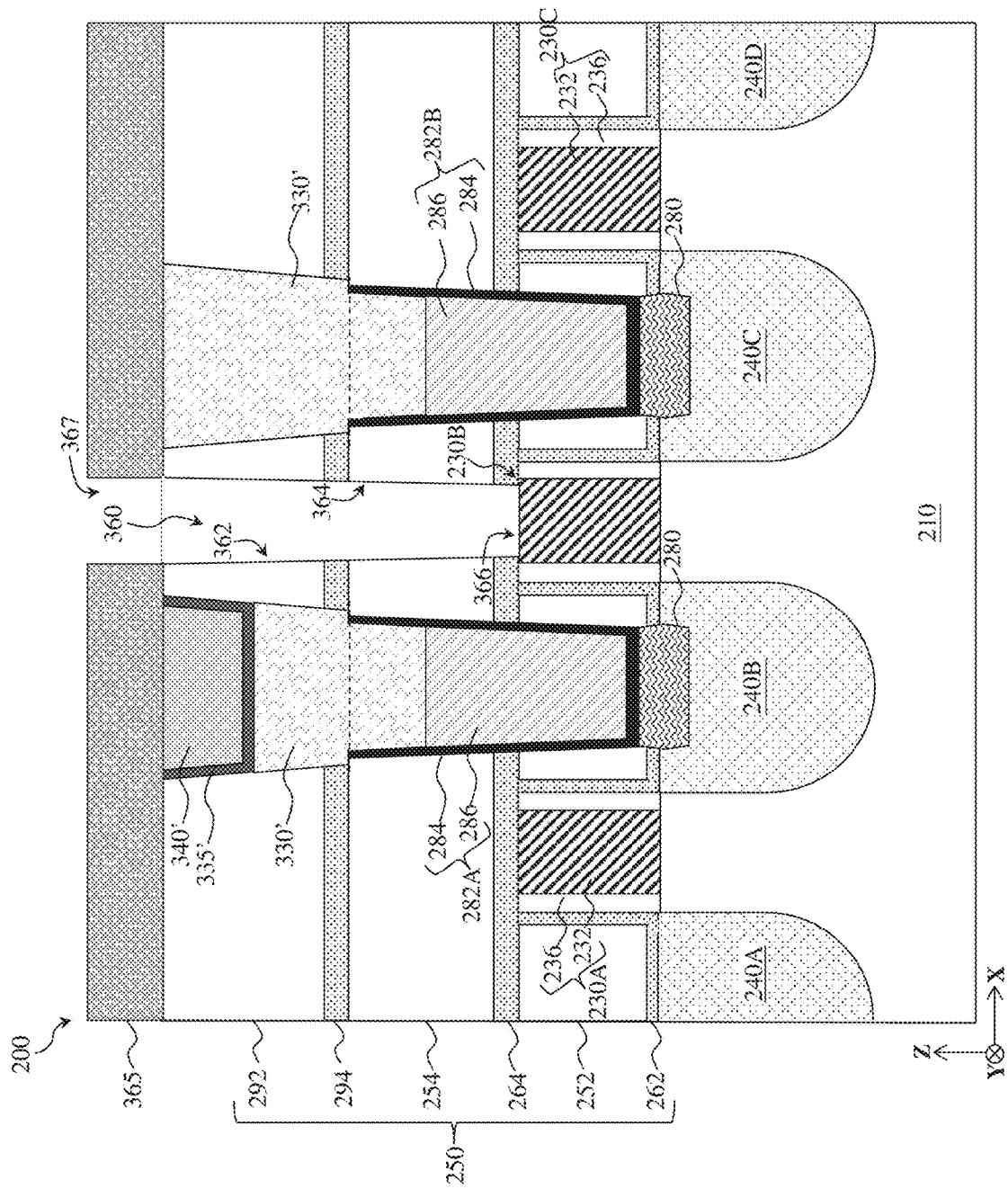

Turning to FIGS. 12-15, a via is formed to one or more gate structures of IC device 200, such as gate structure 230B. Turning to FIG. 12, an interconnect opening 360 is formed in a dielectric layer by a patterning process, such as those described herein. Interconnect opening 360 extends vertically through ILD layer 292, CESL 294, ILD layer 254, and CESL 264 to metal gate stack 232 of gate structure 230B. Interconnect opening 360 may be referred to as a gate contact (plug) opening. Interconnect opening 360 includes a sidewall 362 (defined by ILD layer 292, CESL 294, ILD layer 254, and CESL 264), a sidewall 364 (defined by ILD layer 292, CESL 294, ILD layer 254, and CESL 264), and a bottom 366 (defined by metal gate stack 232) that extends between sidewall 362 and sidewall 364. In FIG. 12, interconnect opening 360 has a trapezoidal shape, though the present disclosure contemplates interconnect opening 360 having other shapes, such as a rectangular shape. Sidewalls 362, 364 are tapered, such that a bottom width of interconnect opening 360, exposing metal gate stack 232 of gate structure 230B, is less than a top width of interconnect opening 360 at a top surface of ILD layer 292. A width of interconnect opening 360 thus decreases along the z-direction from top to bottom of interconnect opening 360. In some embodiments, the width of interconnect opening 360 increases along the z-direction. In some embodiments, the width of interconnect opening 360 is substantially the same along the z-direction.

In some embodiments, the patterning process includes performing a lithography process to form a patterned mask layer 365 having an opening 367 (substantially aligned with metal gate stack 232 of gate structure 230B) and performing an etching process to transfer a pattern defined in patterned mask layer 365 to an underlying dielectric layer (here, ILD layer 292, CESL 294, ILD layer 254, and CESL 264). The patterning process for forming patterned mask layer 365 and interconnect opening 360 may be similar to the patterning process for forming patterned mask layer 278 and interconnect openings 300A, 300B as described above. In some embodiments, patterned mask layer 365 is a patterned resist layer. In such embodiments, the patterned resist layer is used as an etch mask to remove portions of the underlying dielectric layer exposed by opening 367. In some embodiments, the patterned resist layer is formed over a mask layer formed over the underlying dielectric layer before forming the resist layer, and the patterned resist layer is used as an etch mask to remove portions of the mask layer formed over the underlying dielectric layer, thereby forming patterned mask layer 365. In such embodiments, the patterned mask layer is used as an etch mask to remove portions of the underlying dielectric layer exposed by opening 367. Various selective etching processes can be performed to form interconnect opening 360. For example, the etching process can include a first etch that selectively etches ILD layer 292 relative to patterned mask layer 365 and CESL 294, such that the first etch stops upon reaching CESL 294; a second etch that selectively etches CESL 294 relative to ILD layers 294, 254, such that the second etch stops upon reaching ILD layer 254; a third etch that selectively etches ILD layer 254 relative to CESLs 294, 264, such that the third etch stops upon reaching CESL 264; and a fourth etch that selectively etches CESL 264 relative to ILD layers 292, 254 and metal gate stack 232 of gate structure 230B, such that the fourth etch stops upon reaching metal gate stack 232. In some embodiments, the first etch, the second etch, the third etch, and the fourth etch may be configured to slightly over etch as described herein. In some embodiments, the etching process may include multiple steps for etching CESLs 294, 264. In some embodiments, the etching process implements an etchant with low etch selectivity between ILD layers 292, 254 and CESLs 294, 264, such that interconnect opening 360 is formed in a single etch step based on, for example, time. In some embodiments, after the etching process, patterned mask layer 365 is removed from ILD layer 292 (in some embodiments, by a resist stripping process). In some embodiments, patterned mask layer 365 is removed during etching of ILD layer 292, CESL 294, ILD layer 254, and/or CESL 264.

Figure 13:
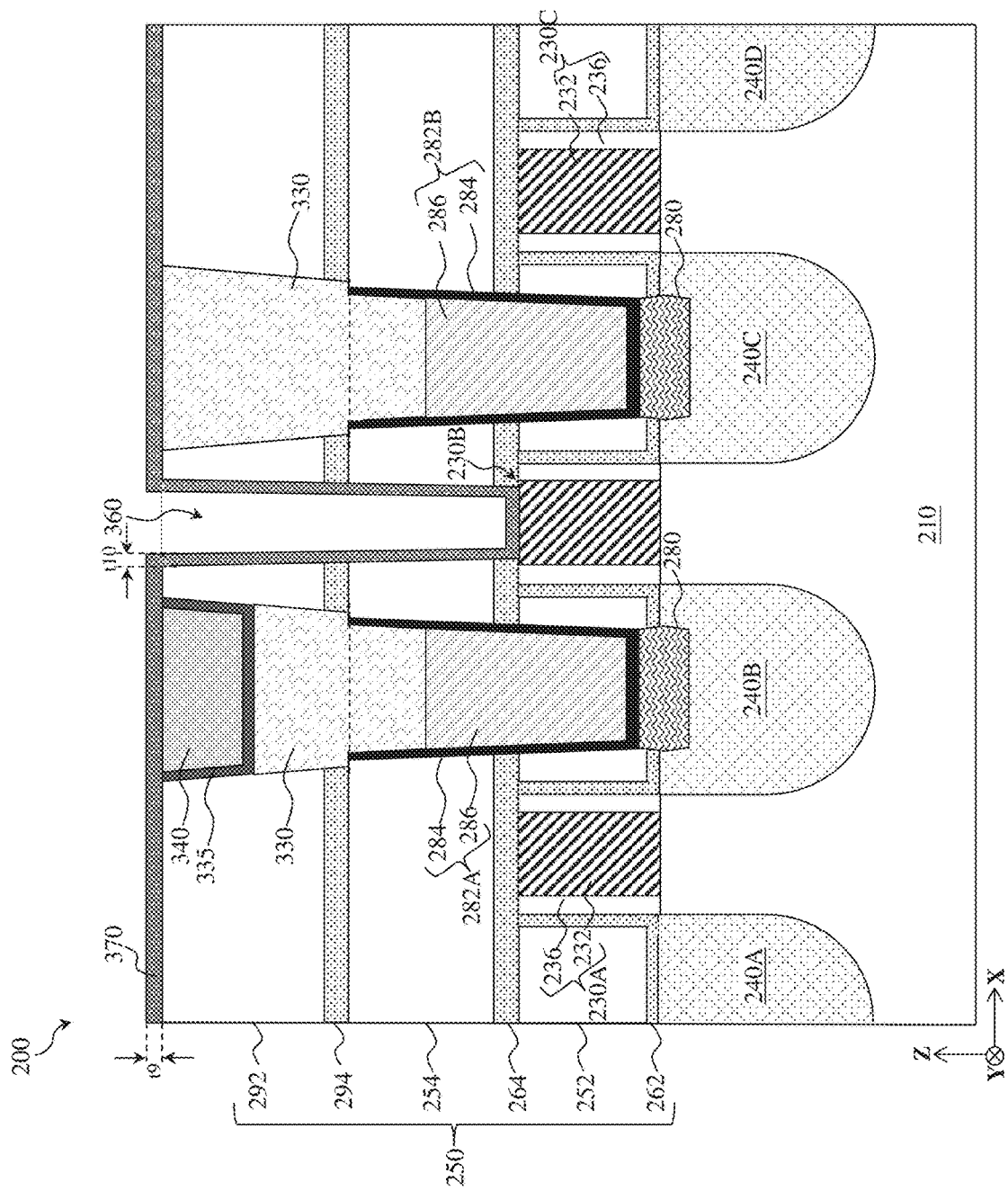

Turning to FIG. 13, a via barrier layer 370 (also referred to as a via liner layer) is formed over IC device 200. For example, via barrier layer 370 is formed over the top surface of ILD layer 292, top surfaces of vias 350A, 350B, sidewalls 362, 364 of interconnect opening 360A, and bottom 366 of interconnect opening 360. Via barrier layer 370 is formed in and partially fills interconnect opening 360. In the depicted embodiment, via barrier layer 370 has a thickness t9 over the top surface of ILD layer 292 and top surfaces of vias 350A, 350B, and a thickness t10 over sidewalls 362, 364 of interconnect opening 360. In the depicted embodiment, thickness t9 is greater than thickness t10. For example, thickness t9 is about 4 nm to about 8 nm, and thickness t10 is about 1 nm to about 3 nm. In some embodiments, via barrier layer 370 is conformally deposited over IC device 200, such that thickness t9 is substantially the same as thickness t10. In some embodiments, thickness t9 is less than thickness t10 depending on process conditions. Via barrier layer 370 includes a material that promotes adhesion between a dielectric material (here, ILD layer 292, CESL 294, ILD layer 254, and CESL 264) and a subsequently formed metal material for filling a remainder of interconnect opening 360. For example, via barrier layer 370 includes titanium, titanium alloy, tantalum, tantalum alloy, cobalt, cobalt alloy, ruthenium, ruthenium alloy, molybdenum, molybdenum alloy, tungsten, tungsten alloy, other suitable constituent configured to promote and/or enhance adhesion between a metal material and a dielectric material, or combinations thereof. In the depicted embodiment, via barrier layer 370 includes tantalum and nitrogen (for example, tantalum nitride), titanium and nitrogen (for example, titanium nitride), tungsten and nitrogen (for example, tungsten nitride), or tungsten. In some embodiments, via barrier layer 370 includes multiple layers. For example, via barrier layer 370 includes a first sub-layer that includes titanium and a second sub-layer that includes titanium nitride disposed over the first sub-layer. In another example, via barrier layer 370 includes a first sub-layer that includes tantalum and a second sub-layer that includes tantalum nitride. Via barrier layer 370 is deposited by PVD, CVD, ALD, electroplating, electroless plating, other suitable deposition process, or combinations thereof. In some embodiments, via barrier layer 370 is similar to via barrier layer 335 and is formed using processes similar to those described above for forming via barrier layer 335.

Figure 14:
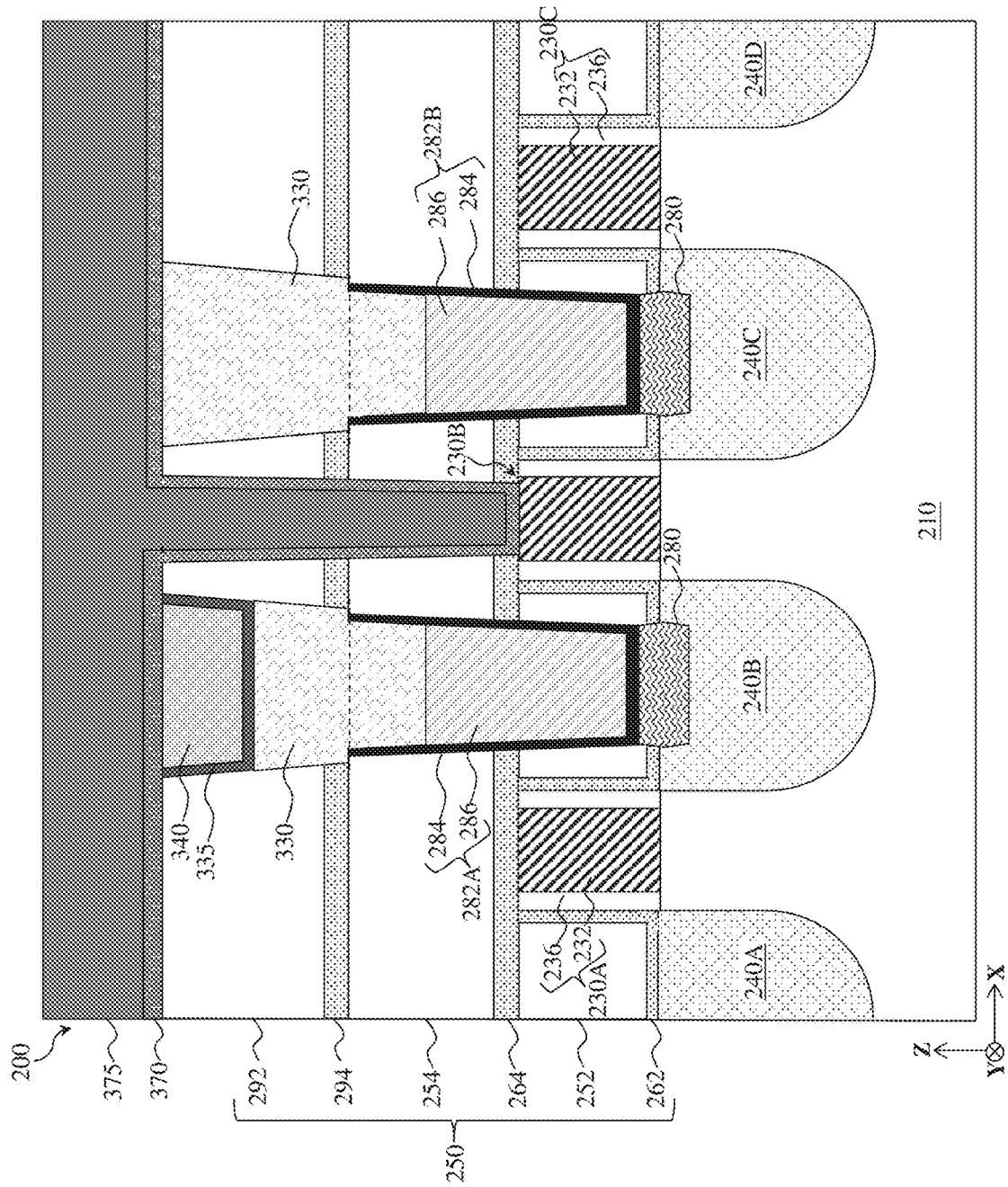

Turning to FIG. 14, a via bulk layer 375 is formed over via barrier layer 370. Via bulk layer 375 is formed in and fills a remainder of interconnect opening 360. In the depicted embodiment, via bulk layer 375 is disposed over and covers the top surface of ILD layer 292 and top surfaces of vias 350A, 350B. Via bulk layer 375 includes tungsten, tungsten alloy, ruthenium, ruthenium alloy, cobalt, cobalt alloy, copper, copper alloy, aluminum, aluminum alloy, iridium, iridium alloy, palladium, palladium alloy, platinum, platinum alloy, nickel, nickel alloy, other low resistivity metal constituent and/or alloys thereof, or combinations thereof. In the depicted embodiment, via bulk layer 375 includes tungsten. Via bulk layer 375 is deposited by PVD, CVD, ALD, electroplating, electroless plating, other suitable deposition process, or combinations thereof. In some embodiments, via bulk layer 375 is similar to via bulk material 340 and is formed using processes similar to those described above for forming via bulk material 340. For example, a blanket deposition process, such as blanket CVD, is performed to deposit via bulk material 375 over via barrier layer 370.

Figure 15:
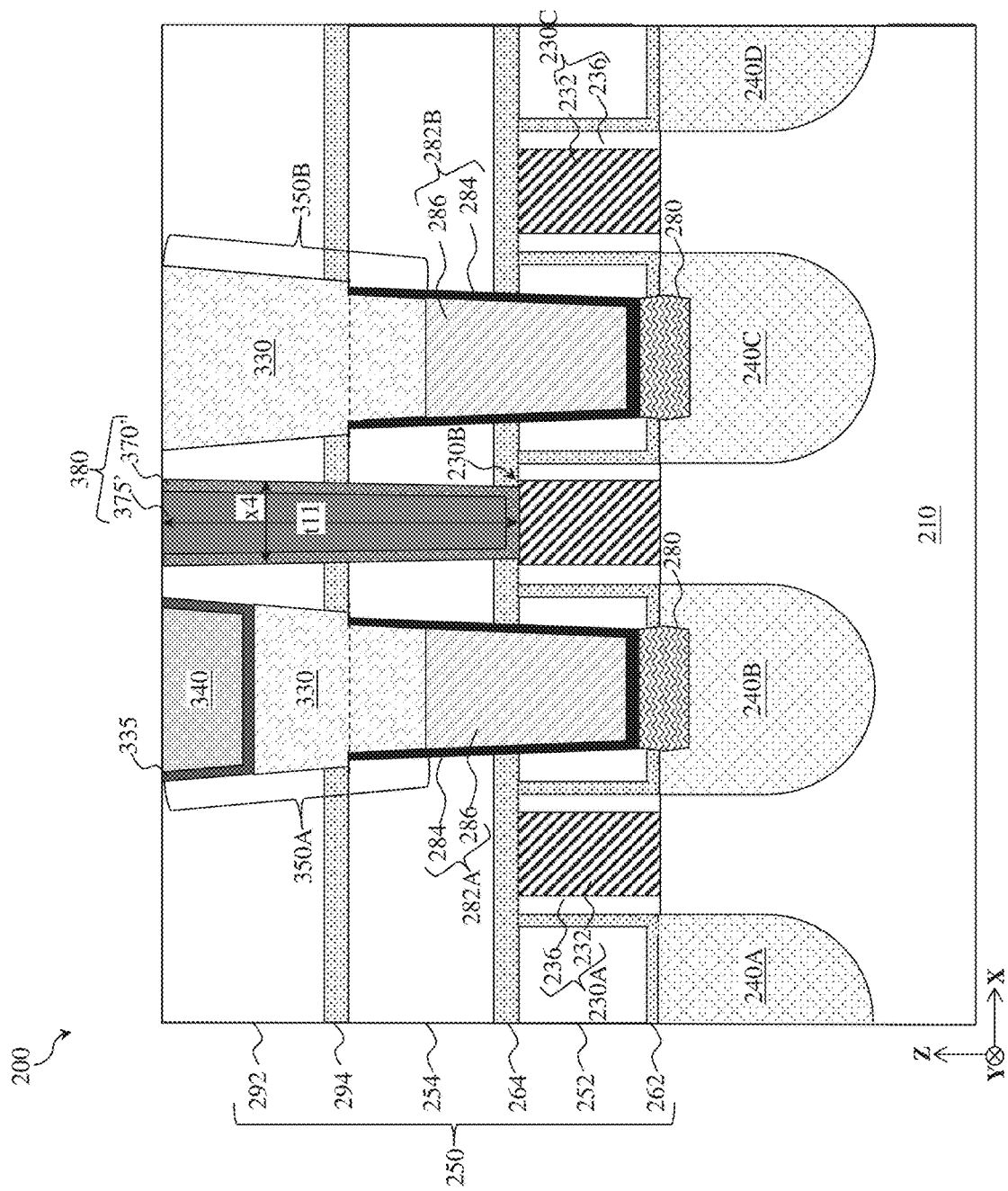

Turning to FIG. 15, a CMP process and/or other planarization process is performed to remove excess via bulk layer 375 and via barrier layer 370 (such as that disposed over the top surface of ILD layer 292 and the top surfaces of vias 350A, 350B), resulting in a via 380 of MLI feature 250. Via 380 includes via bulk material 375 and via barrier layer 370 that remains in interconnect opening 360 after the planarization process, which are referred to respectively as a via bulk layer 375' and a via barrier layer 370'. Via 380 electrically couples and/or physically couples metal gate stack 232 of gate structure 230B to a conductive feature of MLI feature 250, such as a third conductive line of a metal layer of MLI feature 250 (for example, the M1 layer). Via 380 can thus be referred to as a via-to-gate. Via 380 extends through ILD layer 292, CESL 294, ILD layer 254, and CESL 264. Via 380 has a width x4 along the x-direction and a thickness t11 along the z-direction. In the depicted embodiment, thickness t11 is greater than thickness t6 of vias 350A, 350B, and width x4 is less than width x1 of vias 350A, 350B. The CMP process can planarize top surfaces of via 380, such that the top surface of ILD layer 292, the top surfaces of vias 350A, 350B, and the top surface of via 380 are substantially planar surfaces.

Figure 16:
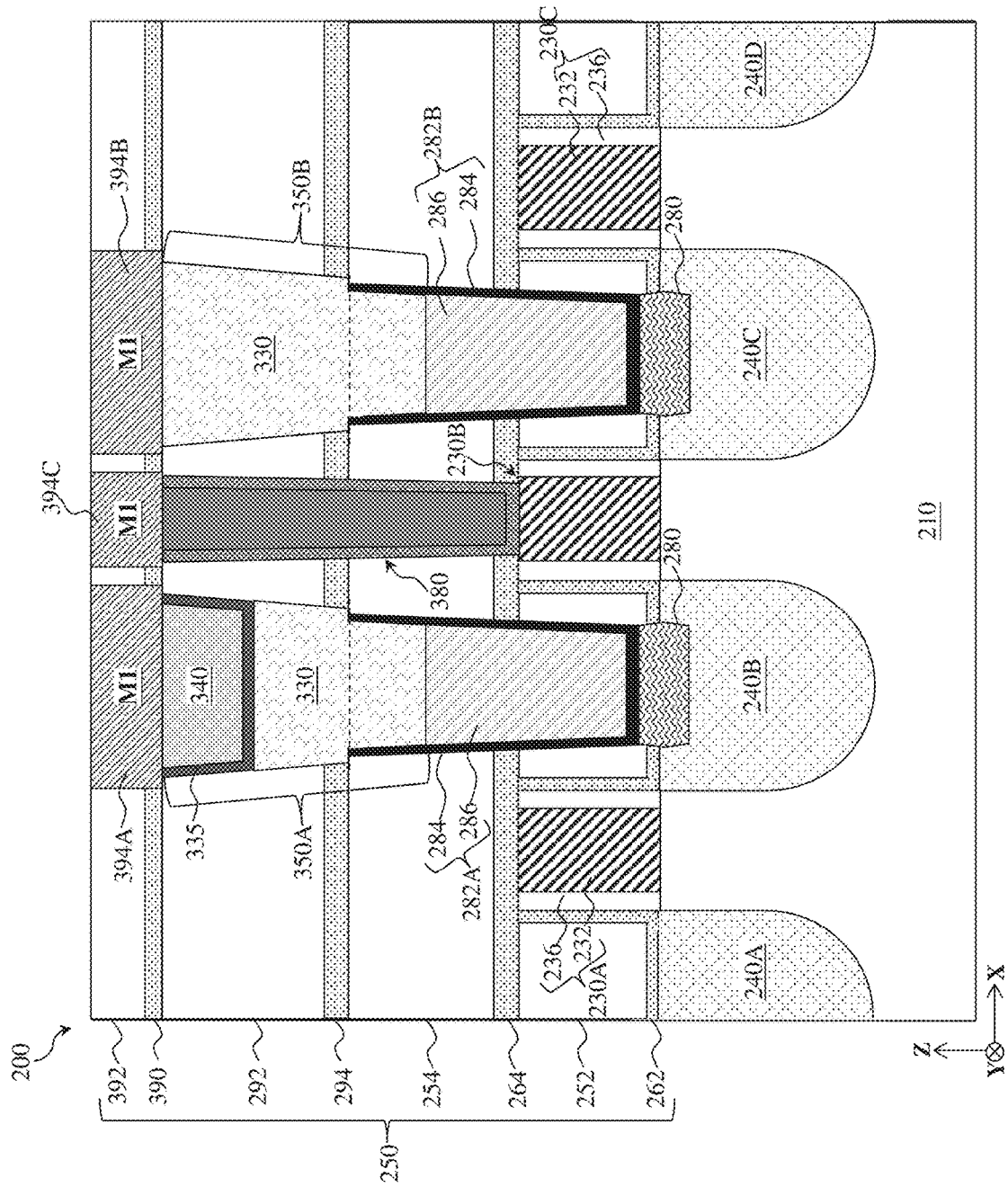

Turning to FIG. 16, fabrication of MLI feature 250 can continue, for example, by forming additional dielectric layers and metal layers of MLI feature 250. For example, a CESL 390 (similar to CESLs 262, 264, 294) is formed over ILD layer 292, vias 350A, 350B, and via 380, an ILD layer 392 (similar to ILD layers 252, 254, 292) is formed over CESL 390, and one or more conductive lines (for example, a conductive line 394A, a conductive line 394B, and a conductive line 394C) are formed in ILD layer 392 and CESL 390. Conductive lines 394A-394C include tungsten, ruthenium, cobalt, copper, aluminum, iridium, palladium, platinum, nickel, other low resistivity metal constituent, alloys thereof, or combinations thereof. In some embodiments, forming conductive lines 394A-394C includes performing a lithography and etching process to form three interconnect openings in ILD layer 392 and CESL 390 (here, exposing via 350A, via 350B, and via 380), filling the interconnect openings with a conductive material, and performing a planarization process that removes excess conductive material, such that the conductive material and ILD layer 392 have substantially planar surfaces. The interconnect openings have sidewalls defined by ILD layer 392 (along with CESL 390) and a bottom defined by a respective via. The conductive material is formed by a deposition process (for example, PVD, CVD, ALD, and/or other suitable deposition process) and/or annealing process. In some embodiments, conductive lines 394A-394C include a bulk layer (also referred to as a conductive plug). In some embodiments, conductive lines 394A-394C includes a barrier layer, an adhesion layer, and/or other suitable layer disposed between the bulk layer and ILD layer 392 (along with CESL 390). In such embodiments, the barrier layer and/or the adhesion layer conform to the interconnect openings, such that the barrier layer and/or the adhesion layer are disposed on ILD layer 392 (along with CESL 390) and the bulk layer is disposed on the barrier layer and/or the adhesion layer. In some embodiments, the barrier layer, the adhesion layer, and/or other suitable layer include titanium, titanium alloy (for example, TiN), tantalum, tantalum alloy (for example, TaN), other suitable constituent, or combinations thereof. In the depicted embodiment, conductive lines 394A-394C have a rectangular-shaped cross-section. For example, conductive line 394A-394C has a substantially planar bottom surface, a substantially planar top surface, and substantially planar sidewalls. In some embodiments, sidewalls of conductive lines 394A-394C are tapered, such that a thickness of conductive lines 394A-394C decreases from a top surface of ILD layer 390 to the top surface of ILD layer 292. In furtherance of the depicted embodiment, conductive line 394A physically contacts via 350A, conductive line 394B physically contacts via 350B, and conductive line 394C physically contacts via 380. In some embodiments, conductive line 394A and conductive line 394B respectively electrically couple epitaxial source/drain features 240B, 240C to a first voltage, and conductive line 394C electrically couples metal gate 232 to a second voltage.

In FIG. 16, MLI feature 250 includes a metal-0 (M0) layer (which includes source/drain contacts 282A, 282B), a metal-1 (M1) layer (which includes conductive lines 394A-394C), and a via-0 (V0) layer (which includes vias 350A, 350B and via 380) that physically and electrically connects the M0 layer to the M1 layer. The M0 layer is a lowest, bottommost contact/metal layer of MLI feature 250 and physically contacts device features at a substrate level (for example, source/drain features and/or gate structures), the V0 layer is a lowest, bottommost via layer of MLI feature 250, and the M1 layer is a second lowest, bottommost contact/metal layer of MLI feature 250. The M0 layer can also be referred to as a contact layer, local interconnect layer, or device-level contact layer. In the depicted embodiment, via 380 directly and physically contacts gate structure 230B. In some embodiments, the M0 layer further includes a gate contact disposed between via 380 and gate structure 230B, where via 380 physically contacts the gate contact and the gate contact physically contacts gate structure 230B. In such embodiments, the gate contact may be configured similar to source/drain contacts 282A, 282B. For example, the gate contact may include a contact bulk layer, such as contact bulk layer 286, disposed over a contact barrier layer, such as contact barrier layer 284. In such embodiments, in contrast to contact bulk layer 286 of source/drain contacts 282A, 282B, the contact bulk layer of the gate contact is not recessed when forming via 380, such that the contact barrier layer of the gate contact is not disposed along a portion of sidewalls of via 380. In some embodiments, the present disclosure contemplates recessing the contact bulk layer of the gate contact before forming via 380, such that via 380 extends into the gate contact similar to vias 350A, 350B. Though not depicted, it is understood that MLI feature 250 can include additional metal layers and/or via layers formed over the M1 layer, such as a via-2 (V2) layer disposed over the M1 layer, a metal-2 (M2) layer disposed over the V2 layer, and so forth to provide desired electrical connection for IC device 200. Fabrication can then continue fabrication of MLI feature 250. For example, additional levels of MLI feature 250 can be formed over the M1 layer, such as an M2 layer to an Mn layer, where n represents a number of metal layers in MLI feature 250 and each of M2 layer to Mn layer include conductive lines, similar to conductive lines 394A-394C disposed in a dielectric material. Vias, similar to vias 350A, 350B, can be fabricated to connect directly adjacent metal layers, such as M2 layer to M3 layer. In some embodiments, vias may connect non-adjacent metal layers.

From the foregoing description, it can be seen that vias described in the present disclosure offer advantages over conventional vias. It is understood, however, that other embodiments may offer additional advantages, and not all advantages are necessarily disclosed herein, and that no particular advantage is required for all embodiments. One advantage is that vias-to-contacts and vias-to-gates are provided with different configurations (in particular, different interface configurations) to optimize contact resistance reduction. For example, vias-to-contacts are at least partially barrier free to increase dimensions of vias-to-contacts openings, which improves metal filling of the via-to-contact openings (in some embodiments, reducing or eliminating voids within the vias-to-contacts) and reduces via-to-contact resistance, while vias-to-gates have a via barrier layer to ensure minimal via-to-gate resistance. The present disclosure notes that, when via barrier layers are implemented in both vias-to-contacts and vias-to-gates, interfaces in vias-to-contacts (e.g., between via barrier layers and source/drain contacts) cannot achieve the same resistance reduction as interfaces in vias-to-gates (e.g., between via barrier layers and metal gates), and that any resistance reduction provided by the via barrier layers in vias-to-contacts does not significantly outweigh risks of voids forming in vias-to-contacts when the via barrier layers are incorporated therein. Removing the via barrier layers from the vias-to-contacts thus lowers any risk of void formation and thus minimizes vias-to-contacts resistance as well as, if not more than, vias-to-contacts having via barrier layers. For example, vias-to-contacts having via barrier layers may have voids therein, leading to increasing resistance of vias-to-contacts more than provided by any lowering of the resistance provided by incorporating the via barrier layers. In another example, via bulk material of vias-to-contacts formed by a bottom-up deposition process, as described herein, exhibit low resistance characteristics. In yet another example, forming a via barrier layer and an additional via bulk layer after the bottom-up deposition process ensures complete filling of via-to-contact openings (accounting for growth variations that arise from the bottom-up deposition process) and/or minimizes internal stress of the via bulk layer and thus reduces or eliminates cracking of the via bulk layer during planarization and/or other subsequent processing. The disclosed via fabrication methods thus account for various via interface requirements and/or considerations.

The present disclosure provides for many different embodiments. An exemplary interconnect structure includes a first source/drain contact and a second source/drain contact disposed in a dielectric layer. The first source/drain contact physically contacts a first source/drain feature and the second source/drain contact physically contacts a second source/drain feature. A first via having a first via layer configuration, a second via having a second via layer configuration, and a third via having a third via layer configuration are disposed in the dielectric layer. The first via and the second via extend into and physically contact the first source/drain contact and the second source/drain contact, respectively. A first thickness of the first via and a second thickness of the second via are the same. The third via physically contacts a gate structure, which is disposed between the first source/drain contact and the second source/drain contact. In some embodiments, the first via includes a first upper portion disposed over a first lower portion and the second via includes a second upper portion disposed over a second lower portion. In such embodiments, the dielectric layer physically contacts sidewalls of the first upper portion and the first source/drain contact physically contacts sidewalls of the first lower portion and the dielectric layer physically contacts sidewalls of the second upper portion and the second source/drain contact physically contacts sidewalls of the second lower portion. In some embodiments, each of the first via and the second via have a first cross-sectional profile along a first direction and a second cross-sectional profile along a second direction. The first direction is different than the second direction and the first cross-sectional profile is different than the second cross-sectional profile. In some embodiments, each of the first via and the second via have a first bottom interface profile with the first source/drain contact and the second source/drain contact, respectively, along a first direction and a second bottom interface profile with the first source/drain contact and the second source/drain contact, respectively, along a second direction. The first direction is different than the second direction, the first bottom interface profile is defined by a substantially planar surface, and the second bottom interface profile is defined by a substantially curved surface.

In some embodiments, the dielectric layer includes a first interlevel dielectric layer, a second interlevel dielectric layer disposed over the first interlevel dielectric layer, and a contact etch stop layer disposed between the first interlevel dielectric layer and the second interlevel dielectric layer. The first source/drain contact and the second source/drain contact are disposed in and extend through the first interlevel dielectric layer. The first via and the second via are disposed in and extend through the second interlevel dielectric layer and the contact etch stop layer. In such embodiments, a first portion of the first via extending into the first source/drain contact physically contacts a bottom surface of the contact etch stop layer and a second portion of the second via extending into the second source/drain contact physically contacts the bottom surface of the contact etch stop layer.

In some embodiments, the first via having the first via layer configuration includes a first via bulk layer, a second via bulk layer disposed over the first via bulk layer, and a via barrier layer disposed between the first via bulk layer and the second via bulk layer. The first via bulk layer physically contacts the dielectric layer and the via barrier layer is further disposed between the second via bulk layer and the dielectric layer. In furtherance of such embodiments, the second via having the second via layer configuration includes a third via bulk layer that physically contacts the dielectric layer. The first via bulk layer and the third via bulk layer include a same material, the third via bulk layer has the second thickness, and the first via bulk layer has a third thickness that is less than the first thickness. In some embodiments, the first source/drain contact includes a first contact barrier layer and a first contact bulk layer, and the second source/drain contact includes a second contact barrier layer and a second contact bulk layer. In some embodiments, a first portion of the first contact barrier layer is disposed between the first contact bulk layer and the dielectric layer, and a second portion of the first contact barrier layer is disposed between the first via bulk layer and the dielectric layer. In some embodiments, a first portion of the second contact barrier layer is disposed between the second contact bulk layer and the dielectric layer, and a second portion of the second contact barrier layer is disposed between the third via bulk layer and the dielectric layer.

In some embodiments, the first via having the first via layer configuration includes a first via bulk layer, a second via bulk layer disposed over the first via bulk layer, and a first via barrier layer disposed between the first via bulk layer and the second via bulk layer. The first via bulk layer physically contacts the dielectric layer and the first via barrier layer is further disposed between the second via bulk layer and the dielectric layer. In furtherance of such embodiments, the second via having the second via layer configuration includes a third via bulk layer, a fourth via bulk layer disposed over the third via bulk layer, and a second via barrier layer disposed between the third via bulk layer and the fourth via bulk layer. The third via bulk layer physically contacts the dielectric layer and the second via barrier layer is further disposed between the fourth via bulk layer and the dielectric layer. In some embodiments, the first via bulk layer and the third via bulk layer include a first material, the second via bulk layer and the fourth via bulk layer include a second material, and the first via barrier layer and the second via barrier layer include a third material. In some embodiments, a first distance between the first via barrier layer and a substrate is different than a second distance between the second via barrier layer and the substrate. In some embodiments, the first source/drain contact includes a first contact barrier layer and a first contact bulk layer, and the second source/drain contact includes a second contact barrier layer and a second contact bulk layer. A first portion of the first contact barrier layer is disposed between the first contact bulk layer and the dielectric layer and a second portion of the first contact barrier layer is disposed between the first via bulk layer and the dielectric layer. A first portion of the second contact barrier layer is disposed between the second contact bulk layer and the dielectric layer and a second portion of the second contact barrier layer is disposed between the third via bulk layer and the dielectric layer.

An exemplary device includes a gate structure disposed over a substrate. The gate structure is disposed between a first source/drain feature and a second source/drain feature. The device further includes a first source/drain contact and a second source/drain contact disposed in a dielectric layer. The first source/drain contact physically contacts the first source/drain feature and the second source/drain contact physically contacts the second source/drain feature. The device further includes a first via, a second via, and a third via disposed in the dielectric layer. The first via physically contacts the first source/drain contact, the second via physically contacts the second source/drain contact, and the third via physically contacts the gate structure. The first via includes a first metal fill layer having first sidewalls that physically contact the dielectric layer. The second via includes a second metal fill layer having second sidewalls that physically contact the dielectric layer. The third via includes a third metal fill layer disposed over a metal barrier layer. The metal barrier layer is disposed between the third metal fill layer and the dielectric layer, such that third sidewalls of the third metal fill layer do not physically contact the dielectric layer. In some embodiments, the first via and the second via have a first cross-sectional profile along a first direction and a second cross-sectional profile along a second direction. The first direction is different than the second direction. A first bottom of the first via and a second bottom of the second via have a substantially planar surface in the first cross-sectional profile and a substantially curved surface in the second cross-sectional profile.

In some embodiments, the metal barrier layer is a first metal barrier layer. In such embodiments, the first via has a first portion that includes the first metal fill layer and a second portion disposed over the first portion. The second portion includes a fourth metal fill layer disposed over a second metal barrier layer, the second metal barrier layer is disposed between the fourth metal fill layer and the dielectric layer, such that fourth sidewalls of the fourth metal fill layer do not physically contact the dielectric layer, and the second metal barrier layer is disposed between the first metal fill layer and the fourth metal fill layer. In some embodiments, the first via and the second via have a first thickness, the first metal fill layer has a second thickness that is less than the first thickness, and the second metal fill layer has a third thickness that is equal to the first thickness. In some embodiments, the second via has a third portion that includes the second metal fill layer and a fourth portion disposed over the third portion. The fourth portion includes a fifth metal fill layer disposed over a third metal barrier layer, the third metal barrier layer is disposed between the fifth metal fill layer and the dielectric layer, such that fifth sidewalls of the fifth metal fill layer do not physically contact the dielectric layer, and the third metal barrier layer is disposed between the second metal fill layer and the fifth metal fill layer. In some embodiments, the first via and the second via have a first thickness, the first metal fill layer has a second thickness that is less than the first thickness, the second metal fill layer has a third thickness that is less than the first thickness, and the third thickness is different than the second thickness.

In some embodiments, the first source/drain contact includes a first contact bulk layer disposed over a first contact barrier layer and the second source/drain contact includes a second contact bulk layer disposed over a second contact barrier layer. A first portion of the first sidewalls of the first metal fill layer physically contacts the dielectric layer and a second portion of the first sidewalls of the first metal fill layer physically contacts the first contact barrier layer, such that the first contact barrier layer is disposed between the second portion of the first sidewalls of the first metal fill layer and the dielectric layer. A third portion of the second sidewalls of the second metal fill layer physically contacts the dielectric layer and a fourth portion of the second sidewalls of the second metal fill layer physically contacts the second contact barrier layer, such that the second contact barrier layer is disposed between the fourth portion of the second sidewalls of the second metal fill layer and the dielectric layer.

An exemplary method includes forming a first source/drain contact and a second source/drain contact in a dielectric layer. The first source/drain contact physically contacts a first source/drain feature and the second source/drain contact physically contacts a second source/drain feature. The method further includes forming a first via opening and a second via opening in the dielectric layer. The first via opening exposes the first source/drain contact and the second via opening exposes the second source/drain contact. The method further includes recessing the first source/drain contact to extend the first via opening and the second source/drain contact to extend the second via opening and performing a bottom-up deposition process to form a first via bulk layer in the first via opening and a second via bulk layer in the second via opening. A first thickness of the first via bulk layer is different than a second thickness of the second via bulk layer. The method further includes forming a first via barrier layer over the first via bulk layer and the second via bulk layer, forming a third via bulk layer over the first via barrier layer, and performing a planarization process to remove any of the third via bulk layer, the first via barrier layer, the second via bulk layer, and the first via bulk layer that is disposed over a top surface of the dielectric layer, thereby forming a first via having a third thickness and a first via layer configuration and a second via having the third thickness and a second via layer configuration that is different than the first via layer configuration. The method further includes forming a third via opening in the dielectric layer that exposes a gate structure, forming a second via barrier layer that partially fills the third via opening, and forming a fourth via bulk layer over the second via barrier layer. The fourth via bulk layer fills a remainder of the third via opening. The method further includes performing a planarization process to remove any of the fourth via bulk layer and the second via barrier layer that is disposed over the top surface of the dielectric layer, thereby forming a third via having a third via layer configuration that is different than the first via layer configuration and the second via layer configuration. In some embodiments, forming the first via opening and the second via opening in the dielectric layer includes performing a dry etching process, and recessing the first source/drain contact and the second source/drain contact includes performing a wet etching process. In some embodiments, the first source/drain contact and the second source/drain contact each includes a contact bulk layer disposed over a contact barrier layer and recessing the first source/drain contact and the second source/drain contact includes etching the contact bulk layer without substantially etching the contact barrier layer. In some embodiments, each of the forming the third via bulk layer and the forming the fourth via bulk layer includes performing a blanket deposition process.

Another exemplary method includes forming a source/drain contact to a source/drain feature in a first dielectric layer, forming a first via to the source/drain contact, and forming a second via to a gate structure. Forming the first via includes forming a second dielectric layer over the first dielectric layer and forming a first via opening in the second dielectric layer. The first via opening exposes the source/drain contact. Forming the first via further includes recessing the source/drain contact to extend the first via opening, performing a bottom-up deposition process to fill the extended first via opening with a first metal layer, forming a second metal layer over the first metal layer and the second dielectric layer, forming a third metal layer over the second metal layer, and performing a planarization process to remove any of the first metal layer, the second metal layer, and the third metal layer disposed over a top surface of the second dielectric layer. Forming the second via includes forming a second via opening in the second dielectric layer and the first dielectric layer. The second via opening exposes the gate structure. Forming the second via further includes forming a fourth metal layer to partially fill the second via opening and forming a fifth metal layer over the fourth metal layer to fill a remainder of the second via opening. In some embodiments, forming the first metal layer includes forming a first tungsten-comprising layer and forming the third metal layer includes forming a second tungsten-comprising layer. In some embodiments, forming the second metal layer includes forming a titanium-comprising layer.

In some embodiments, the extended first via opening has a first cross-sectional profile along a first direction and a second cross-sectional profile along a second direction. The first direction is different than the second direction. In such embodiments, a bottom of the extended first via opening is defined by a substantially planar surface in the first cross-sectional profile and a substantially curvilinear surface in the second cross-sectional profile. In some embodiments, forming the second metal layer includes depositing a first glue layer and depositing a second glue layer over the first glue layer. In such embodiments, the first glue layer can include titanium and the second glue layer can include titanium and nitrogen. In some embodiments, the first metal layer completely fills the first via opening, such that the first via includes the first metal layer. In some embodiments, forming the first metal layer includes filling a bottom portion of the first via opening with the first metal layer, such that a top portion of the first via opening remains after the forming the first metal layer. In such embodiments, forming the second metal layer includes partially filling the top portion of the first via opening with the second metal layer and forming the third metal layer includes filling a remainder of the top portion of the first via opening with the third metal layer.

In some embodiments, forming the first via opening includes performing a dry etching process and recessing the source/drain contact includes performing a wet etching process. In some embodiments, the source/drain contact includes a metal fill layer disposed over a metal glue layer and recessing the source/drain contact includes etching the metal fill layer without substantially etching the metal glue layer. In some embodiments, the gate structure has a first dimension along a first direction and a second dimension along a second direction that is substantially perpendicular to the first direction. In such embodiments, recessing the source/drain contact to extend the first via opening extends the first via opening under the second dielectric layer along the second direction without extending the first via opening under the second dielectric layer along the first direction. In some embodiments, the first dimension is a gate length and the second dimension is a gate width.

In some embodiments, the source/drain contact is a first source/drain contact and the source/drain feature is a first source/drain feature. In such embodiments, the method can further include forming a second source/drain contact to a second source/drain feature in the first dielectric layer. The gate structure is disposed between the first source/drain feature and the second source/drain feature. In such embodiments, the method can further includes forming a third via in the second dielectric layer to the second source/drain contact while forming the first via to the first source/drain contact. Forming the third via includes forming a third via opening in the second dielectric layer. The third via opening exposes the second source/drain contact. Forming the third via further includes recessing the second source/drain contact to extend the third via opening, performing the bottom-up deposition process to fill the extended third via opening with the first metal layer, forming the second metal layer over the first metal layer and the second dielectric layer, forming the third metal layer over the second metal layer, and performing the planarization process to remove any of the first metal layer, the second metal layer, and the third metal layer disposed over the top surface of the second dielectric layer. In some embodiments, the first metal layer partially fills the first via opening and completely fills the third via opening and extends over the second dielectric layer, thereby forming a first portion of the first metal layer disposed in the first via opening and a second portion of the first metal layer disposed in the third via opening. In some embodiments, the second metal layer partially fills the first via opening and is disposed over the first portion of the first metal layer disposed in the first via opening and the second metal layer is disposed over the second portion of the first metal layer disposed in the third via opening. In some embodiments, the third metal layer partially fills a remainder of the first via opening and is disposed over the second metal layer.

Another exemplary device includes a gate structure disposed over a substrate. The gate structure is disposed between a first source/drain feature and a second source/drain feature. The device further includes a first source/drain contact and a second source/drain contact disposed in a dielectric layer. The first source/drain contact physically contacts the first source/drain feature and the second source/drain contact physically contacts the second source/drain feature. The device further includes a first via, a second via, and a third via disposed in the dielectric layer. The first via physically contacts the first source/drain contact, the second via physically contacts the second source/drain contact, and the third via physically contacts the gate structure. The first via and the second via each include a first metal fill layer that physically contacts the dielectric layer. The third via has a second metal fill layer and a metal glue layer. The metal glue layer is disposed between the second metal fill layer and the dielectric layer. In some embodiments, the metal glue layer is a first metal glue layer, the first via has a first portion where the first metal fill layer physically contacts the dielectric layer, and the first via has a second portion where a second metal glue layer is disposed between the first metal fill layer and the dielectric layer. In some embodiments, the first source/drain contact and the second source/drain contact each include a third metal glue layer disposed between a third metal fill layer and the dielectric layer. In such embodiments, the first via further includes a third portion where the third metal glue layer is disposed between the first metal fill layer and the dielectric layer and the second via includes a portion where the third metal glue layer is disposed between the first metal fill layer and the dielectric layer. In some embodiments, the first via and the second via have a first cross-sectional profile along a first direction and a second cross-sectional profile along a second direction. The first direction is different than the second direction. In such embodiments, a bottom of the first via and a bottom of the second via are defined by a substantially planar surface in the first cross-sectional profile and a substantially curvilinear surface in the second cross-sectional profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 forming a first source/drain contact and a second source/drain contact in a dielectric layer, wherein the first source/drain contact physically contacts a first source/drain feature and the second source/drain contact physically contacts a second source/drain feature;
 forming a first via opening and a second via opening in the dielectric layer, wherein the first via opening exposes the first source/drain contact and the second via opening exposes the second source/drain contact;
 recessing the first source/drain contact to extend the first via opening and the second source/drain contact to extend the second via opening;
 performing a bottom-up deposition process to form a first via bulk layer in the first via opening and a second via bulk layer in the second via opening, wherein a first thickness of the first via bulk layer is different than a second thickness of the second via bulk layer;
forming a first via barrier layer over the first via bulk layer and the second via bulk layer;
forming a third via bulk layer over the first via barrier layer; and
performing a planarization process to remove any of the third via bulk layer, the first via barrier layer, the second via bulk layer, and the first via bulk layer that is disposed over a top surface of the dielectric layer, thereby forming a first via having a third thickness and a first via layer configuration and a second via having the third thickness and a second via layer configuration that is different than the first via layer configuration.

2. The method of claim 1, wherein:
the forming the first via opening and the second via opening in the dielectric layer includes performing a dry etching process; and
the recessing the first source/drain contact and the second source/drain contact includes performing a wet etching process.

3. The method of claim 1, wherein:
the first source/drain contact and the second source/drain contact each include a contact bulk layer disposed over a contact barrier layer; and
the recessing the first source/drain contact and the second source/drain contact includes etching the contact bulk layer without substantially etching the contact barrier layer.

4. The method of claim 1, wherein the forming the third via bulk layer includes performing a blanket deposition process.

5. The method of claim 1, wherein the performing the bottom-up deposition process to form the first via bulk layer in the first via opening and the second via bulk layer in the second via opening includes:
filling the first via opening with the first via bulk layer having a first height; and
filling the second via opening with the second via bulk layer having a second height, wherein the second height is different than the first height.

6. The method of claim 5, wherein the performing the bottom-up deposition process to form the first via bulk layer in the first via opening and the second via bulk layer in the second via opening includes tuning parameters of the bottom-up deposition process to provide the first via opening and the second via opening with a first aspect ratio and a second aspect ratio, respectively, that is less than about 3.

7. The method of claim 1, wherein the second via bulk layer includes a via rivet head and the method further includes tuning parameters of the bottom-up deposition process to constrain a height of the via rivet head above the top surface of the dielectric layer.

8. The method of claim 7, wherein the planarization process removes the via rivet head of the second via bulk layer.

9. The method of claim 1, further comprising:
forming a third via opening in the dielectric layer that exposes a gate structure;
forming a second via barrier layer that partially fills the third via opening;
forming a fourth via bulk layer over the second via barrier layer, wherein the fourth via bulk layer fills a remainder of the third via opening; and
performing a planarization process to remove any of the fourth via bulk layer and the second via barrier layer that is disposed over the top surface of the dielectric layer, thereby forming a third via having a third via layer configuration that is different than the first via layer configuration and the second via layer configuration.

10. A method comprising:
forming a first opening and a second opening in a first dielectric layer, wherein the first opening and the second opening expose a first interconnect structure and a second interconnect structure, respectively, disposed in a second dielectric layer;
etching back a first bulk layer and a second bulk layer of the first interconnect structure and the second interconnect structure, respectively, to extend the first opening and the second opening below a top surface of the second dielectric layer;
forming a third bulk layer and a fourth bulk layer in the first opening and the second opening, respectively, wherein the third bulk layer is over the first bulk layer of the first interconnect structure, the fourth bulk layer is over the second bulk layer of the second interconnect structure, the third bulk layer has a first thickness, and the fourth bulk layer has a second thickness that is different than the first thickness;
forming a barrier layer over the third bulk layer and the fourth bulk layer;
forming a fifth bulk layer over the barrier layer; and
removing any of the fifth bulk layer, the barrier layer, the third bulk layer, and the fourth bulk layer that is disposed over a top surface of the first dielectric layer, thereby forming a third interconnect structure having a third thickness and a first configuration of layers and a fourth interconnect structure having the third thickness and a second configuration of layers that is different than the first configuration of layers.

11. The method of claim 10, wherein after the etching back:
the first bulk layer of the first interconnect structure and the second bulk layer of the second interconnect structure have a first cross-sectional profile along a first direction and a second cross-sectional profile along a second direction, wherein the first direction is different than the second direction; and
the first bulk layer of the first interconnect structure and the second bulk layer of the second interconnect structure have substantially planar top surfaces in the first cross-sectional profile and substantially curved surfaces in the second cross-sectional profile.

12. The method of claim 10, wherein the forming the third bulk layer and the fourth bulk layer in the first opening and the second opening, respectively, includes:
partially filling the first opening with the third bulk layer; and
completely filling the second opening with the fourth bulk layer.

13. The method of claim 12, wherein:
the forming the barrier layer over the third bulk layer includes partially filling the first opening with the barrier layer; and
forming the fifth bulk layer over the barrier layer includes filling a remainder of the first opening with the fifth bulk layer.

14. The method of claim 10, wherein the forming the third bulk layer and the fourth bulk layer in the first opening and the second opening, respectively, includes performing a selective chemical vapor deposition process to grow a tungsten-containing material.

15. The method of claim 14, wherein the forming the fifth bulk layer over the barrier layer includes performing a blanket chemical vapor deposition process.

16. The method of claim 10, wherein:
the first configuration of layers includes the third bulk layer, the barrier layer, and the fifth bulk layer; and
the second configuration of layers includes the fourth bulk layer and is free of the barrier layer and the fifth bulk layer.

17. A method comprising:
forming a gate structure over a substrate, wherein the gate structure is between a first source/drain feature and a second source/drain feature;
forming a first source/drain contact and a second source/drain contact in a dielectric layer, wherein the first source/drain contact physically contacts the first source/drain feature and the second source/drain contact physically contacts the second source/drain feature; and
forming a first via, a second via, and a third via in the dielectric layer, wherein:
the first via physically contacts the first source/drain contact, the second via physically contacts the second source/drain contact, and the third via physically contacts the gate structure,
the first via includes a first metal fill layer having first sidewalls that physically contact the dielectric layer,
the second via includes a second metal fill layer having second sidewalls that physically contact the dielectric layer, and
the third via includes a third metal fill layer disposed over a metal barrier layer, wherein the metal barrier layer is disposed between the third metal fill layer and the dielectric layer, such that third sidewalls of the third metal fill layer do not physically contact the dielectric layer.

18. The method of claim 17, wherein the forming the first via and the second via in the dielectric layer includes:
performing a bottom-up deposition process; and
performing a blanket deposition process.

19. The method of claim 18, wherein the forming the first via and the second via in the dielectric layer includes recessing the first source/drain contact and the second source/drain contact before performing the bottom-up deposition process.

20. The method of claim 18, wherein:
the bottom-up deposition process and the blanket deposition process are chemical vapor deposition processes; and
the forming the first via and the second via in the dielectric layer further includes performing a physical vapor deposition process after the bottom-up deposition process and before the blanket deposition process.

* * * * *